United States Patent
Park et al.

(10) Patent No.: US 10,103,101 B2
(45) Date of Patent: Oct. 16, 2018

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Je-min Park, Suwon-si (KR); Dae-ik Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 15/347,103

(22) Filed: Nov. 9, 2016

(65) Prior Publication Data

US 2017/0062328 A1    Mar. 2, 2017

Related U.S. Application Data

(62) Division of application No. 14/495,113, filed on Sep. 24, 2014, now Pat. No. 9,570,409.

(30) Foreign Application Priority Data

Oct. 11, 2013    (KR) ........................ 10-2013-0121502

(51) Int. Cl.
*H01L 23/528* (2006.01)
*H01L 23/64* (2006.01)
(Continued)

(52) U.S. Cl.
CPC ............ *H01L 23/528* (2013.01); *G11C 7/062* (2013.01); *G11C 8/10* (2013.01); *H01L 21/32133* (2013.01); *H01L 21/32139* (2013.01); *H01L 21/76816* (2013.01); *H01L 21/76877* (2013.01); *H01L 21/76895* (2013.01);
(Continued)

(58) Field of Classification Search
CPC ............ H01L 23/528; H01L 21/76816; H01L 21/32133; H01L 21/32139; H01L 21/76877; H01L 27/10891; H01L 27/10885; H01L 23/5226; H01L 21/76895;
(Continued)

(56) References Cited

U.S. PATENT DOCUMENTS 5,194,749 A    3/1993  Meguro et al.
5,289,423 A *  2/1994  Natale .................. H01L 27/115
                                                257/E27.103

(Continued)

FOREIGN PATENT DOCUMENTS

KR    1020120003742 A    1/2012
KR    1020120004241 A    1/2012

*Primary Examiner* — Marc Armand
*Assistant Examiner* — Sue Tang
(74) *Attorney, Agent, or Firm* — Harness, Dickey & Pierce, P.L.C.

(57) ABSTRACT

A semiconductor device includes: a first interconnection line and a second interconnection line which extend apart from each other on a first plane at a first level on a substrate; a bypass interconnection line that extends on a second plane at a second level on the substrate; and a plurality of contact plugs for connecting the bypass interconnection line to the first interconnection line and the second interconnection line. A method includes forming a bypass interconnection line spaced apart from a substrate and forming on a same plane a plurality of interconnection lines connected to the bypass interconnection line via a plurality of contact plugs.

10 Claims, 38 Drawing Sheets

(51) Int. Cl.

| | |
|---|---|
| *H01L 23/522* | (2006.01) |
| *H01L 27/108* | (2006.01) |
| *G11C 7/06* | (2006.01) |
| *G11C 8/10* | (2006.01) |
| *H01L 21/3213* | (2006.01) |
| *H01L 21/768* | (2006.01) |
| *H01L 23/535* | (2006.01) |
| *H01L 23/532* | (2006.01) |

(52) U.S. Cl.
CPC ...... *H01L 23/5221* (2013.01); *H01L 23/5226* (2013.01); *H01L 23/535* (2013.01); *H01L 23/642* (2013.01); *H01L 23/647* (2013.01); *H01L 27/10885* (2013.01); *H01L 27/10891* (2013.01); *H01L 27/10897* (2013.01); *H01L 23/53238* (2013.01); *H01L 2924/0002* (2013.01)

(58) Field of Classification Search
CPC . H01L 23/535; H01L 27/10897; G11C 7/062; G11C 8/10
USPC ......................................................... 257/776
See application file for complete search history.

(56) References Cited

U.S. PATENT DOCUMENTS

| | | | |
|---|---|---|---|
| 6,236,117 | B1 | 5/2001 | Ishigaki et al. |
| 6,815,762 | B2 * | 11/2004 | Yoshida .............. H01L 21/2652 257/323 |
| 8,120,123 | B2 | 2/2012 | Yoshida et al. |
| 8,298,893 | B2 | 10/2012 | Kim |
| 8,324,673 | B2 | 12/2012 | Chung et al. |
| 8,373,234 | B2 | 2/2013 | Park et al. |
| 2005/0258498 | A1 | 11/2005 | Suzuki |
| 2007/0081108 | A1 * | 4/2007 | Tsukada ............. G02F 1/136259 349/54 |
| 2009/0114991 | A1 | 5/2009 | Kim et al. |
| 2012/0091532 | A1 | 4/2012 | Han et al. |
| 2012/0153363 | A1 | 6/2012 | Shin |
| 2012/0161217 | A1 | 6/2012 | Sato |
| 2013/0015588 | A1 | 1/2013 | Park et al. |

* cited by examiner

SEMICONDUCTOR DEVICE AND METHOD OF MANUFACTURING THE SAME

CROSS-REFERENCE TO RELATED APPLICATIONS

This application is a divisional application of U.S. application Ser. No. 14/495,113, filed Sep. 24, 2014, which claims priority to Korean Patent Application No. 10-2013-0121502, filed on Oct. 11, 2013, in the Korean Intellectual Property Office, the disclosure of which is incorporated herein in its entirety by reference.

BACKGROUND

Example embodiments of the inventive concepts relate to a semiconductor device and a method of manufacturing the same, and more particularly, one or more of the example embodiments of the inventive concepts relate to a semiconductor device including an interconnection structure and a method of manufacturing the same.

An increase in the integration density of semiconductor devices has led to a reduction in the design rules of elements of semiconductor devices. As the size of semiconductor devices has been reduced, the distances between a plurality of interconnection lines and a plurality of contact plugs interposed therebetween have been gradually reduced. As a result, parasitic capacitances between adjacent conductive patterns and line resistivity may increase, thereby adversely affecting an operation speed or refresh characteristics of the semiconductor devices.

SUMMARY

Example embodiments of the inventive concepts provide a semiconductor device having an interconnection layout configured to increase or maximize an integration density.

Example embodiments of the inventive concepts also provide a method of manufacturing a semiconductor device having an interconnection layout configured to increase or maximize an integration density.

According to an example embodiment of the inventive concepts, there is provided a semiconductor device including: a first interconnection line and a second interconnection line, which extend apart from each other on a first plane at a first level on a substrate; a bypass interconnection line that extends on a second plane at a second level on the substrate, the second level being different from the first level; and a plurality of contact plugs for connecting the bypass interconnection line to the first interconnection line and the second interconnection line.

Each of the first and second planes may be parallel to the substrate.

The plurality of contact plugs may include: a first contact plug connected between the first interconnection line and the bypass interconnection line; and a second contact plug connected between the second interconnection line and the bypass interconnection line.

Each of the first and second contact plugs may extend in a perpendicular direction to the substrate.

The semiconductor device may further include a direct contact plug contacting an active region of the substrate, wherein the bypass interconnection line is spaced apart from the direct contact plug.

A vertical distance from the substrate to the second plane may be smaller than a vertical distance from the substrate to the first plane.

A vertical distance from the substrate to the second plane may be larger than a vertical distance from the substrate to the first plane.

The semiconductor device may further include a third interconnection line that extends apart from the first interconnection line and the second interconnection line on the first plane, extends parallel to at least one of the first interconnection line and the second interconnection line, and includes a portion which vertically overlaps with the bypass interconnection line.

Each of the first and second interconnection lines may include a portion which vertically overlaps with the bypass interconnection line.

The semiconductor device may further include a bypass interconnection line for short-circuit protection, the bypass interconnection line being positioned on the same plane as the bypass interconnection line.

The semiconductor device may further include: a direct contact plug contacting an active region of the substrate; and a fourth interconnection line that is adjacent to the first interconnection line and the second interconnection line, is disposed on the first plane, and is connected to the direct contact plug, wherein the bypass interconnection line is spaced apart from the direct contact plug and the fourth interconnection line.

According to another example embodiment of the inventive concepts, there is provided a semiconductor device including: a substrate including a cell array area and a core area disposed around the cell array area, the cell array area including a plurality of memory cells; a pair of conductive lines formed in the cell array area; a plurality of buried contacts formed between the pair of conductive lines and being connected to an active region of the substrate; a plurality of conductive landing pads that extend in the cell array area from upper surfaces of the plurality of buried contacts to a top of one of the pair of the conductive lines; first and second interconnection lines that extend in the core area to be apart from each other on a first plane at a first level higher than the upper surfaces of the plurality of conductive landing pads; a bypass interconnection line that extends in the core area on a second plane at a second level lower than the upper surfaces of the plurality of conductive landing pads; and a plurality of contact plugs connected between the bypass interconnection line and the first and second interconnection lines.

The plurality of contact plugs may include the same material as the plurality of landing pads.

The first interconnection line and the second interconnection line may extend in different directions.

The first interconnection line and the second interconnection line may extend parallel to each other.

According to another example embodiment of the inventive concepts, there is provided a method of manufacturing a semiconductor device, the method including: forming a bypass interconnection line spaced apart from a substrate on the substrate having an active region; forming a plurality of contact plugs that is connected to the bypass interconnection line at a position spaced apart from the substrate; and forming a plurality of interconnection lines on the same plane, the plurality of interconnection lines including a first interconnection line, which is connected to the bypass interconnection line via one of the plurality of contact plugs, and a second interconnection line, which is connected to the bypass interconnection line via another of the plurality of contact plugs.

The method may further include forming a direct contact plug, which is connected to the active region of the substrate, at the same time with the plurality of contact plugs.

The direct contact plug may have an upper surface on the same plane as upper surfaces of the plurality of contact plugs.

The forming of the plurality of interconnection lines may include forming a third interconnection line that is adjacent to the first interconnection line and the second interconnection line, is spaced apart from the first interconnection line and the second interconnection line, and is connected to the direct contact plug.

According to another example embodiment of the inventive concepts, there is provided a method of manufacturing a semiconductor device, the method including: providing a substrate including a cell array area and a core area; forming a bypass interconnection line spaced apart from the substrate on the substrate in the core area; forming a plurality of conductive lines on the substrate in the cell array area; forming a plurality of buried contacts that is formed between the plurality of conductive lines in the cell array area and are connected to an active region of the substrate; forming a conductive landing pad and a plurality of contact plugs at the same time, wherein the conductive landing pad extends from an upper surface of any one of the plurality of buried contacts to a top of any one of the plurality of conductive lines in the cell array region, and the plurality of contact plugs are connected to the bypass interconnection line in the core area; and forming a plurality of interconnection lines on the same plane, wherein the plurality of interconnection lines include first and second interconnection lines that extend apart from each other at a level higher than an upper surface of the conductive landing pad in the core area and are connected to the plurality of contact plugs.

The bypass interconnection line may be formed at the same time as the plurality of conductive lines.

The plurality of conductive lines may be formed after the bypass interconnection line is formed.

The forming of the bypass interconnection line may include: forming a conductive layer for the formation of the bypass interconnection line in the core area; forming a core mask pattern on the conductive layer; and etching the conductive layer by using the core mask pattern as an etch mask, wherein the plurality of contact plugs penetrate the core mask pattern.

The forming of the conductive landing pad and the plurality of contact plugs at the same time may include forming a direct contact plug that is connected to the active region of the substrate in the core area, wherein the direct contact plug is formed in a position spaced apart from the core mask pattern.

The method may further include forming an insulating layer covering the bypass interconnection line after the forming of the bypass interconnection line, wherein the plurality of contact plugs penetrate the insulating layer.

At least one example embodiment relates to a semiconductor device.

In at least one embodiment, the semiconductor device includes first and second interconnect lines on a first layer of the semiconductor device, the first and second interconnect lines extending in opposite directions and having a gap therebetween; a non-linear interconnect line on the first layer, the non-linear interconnect line running parallel to the first and second interconnect lines and having a contact region, the contact region being wider than a rest of the non-linear interconnect line; a bypass interconnect line on a second layer of the semiconductor device; and first and second contact plugs respectively connecting the first and second interconnect lines to the bypass interconnect such that the first and second interconnect lines are electrically connected via the bypass interconnect line.

In at least one example embodiment the first and second interconnect lines each include a portion which vertically overlaps with the bypass interconnect line.

In at least one example embodiment, the contact region of the non-linear interconnect line extends in a direction of the first and second interconnect lines such that the distance between the gap and the non-linear interconnect line to less than a feature size of the semiconductor device, and the bypass interconnect line connects the first and second interconnect lines on a separate layer from the first and second interconnect lines such that the feature size of the semiconductor device is maintained.

In at least one example embodiment, the semiconductor device further includes a substrate having the first layer and the second layer thereon; and a direct contact plug extending in a direction perpendicular to the substrate from the contact region to an active region of the substrate.

In at least one example embodiment, the first interconnect line extends in a first direction and the second interconnect line extends in a second direction opposite the first direction, the first and second direction being parallel to the substrate, and the bypass interconnect line is divided into a first region, a second region and a third region between the first and second contact plugs, the first and third regions being perpendicular to the second region and extending an amount in a third direction perpendicular to the first direction and parallel to the substrate such that the bypass interconnect line is electrically isolated from the direct contact plug.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
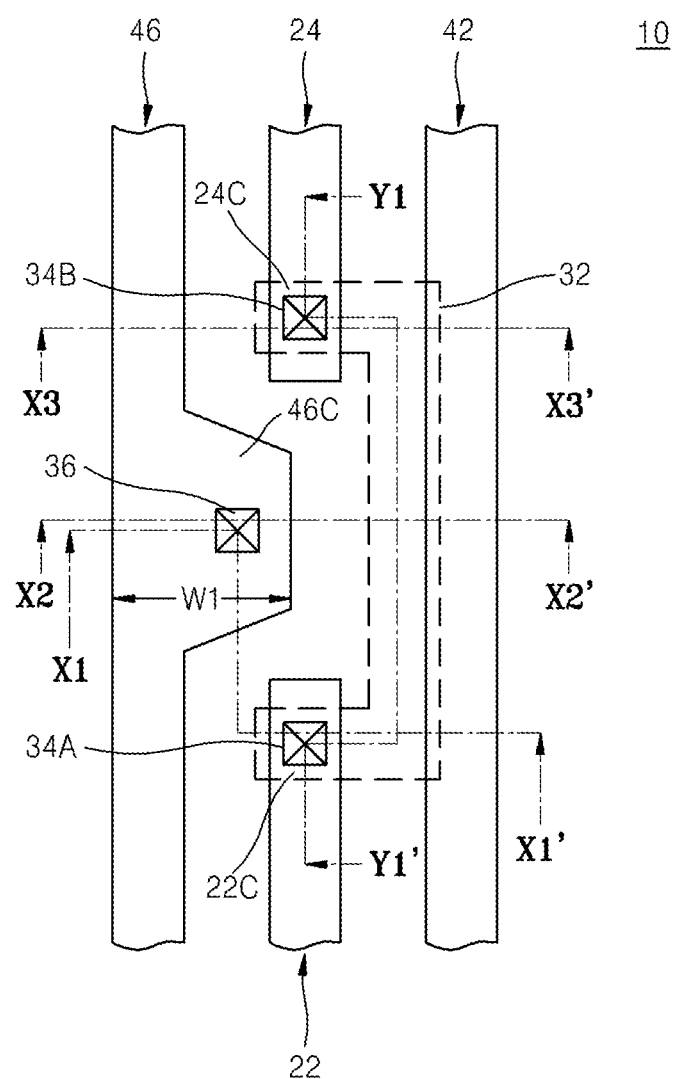
FIG. 1 is a schematic layout of a semiconductor device according to an example embodiment of the inventive concepts.

The example embodiments of the inventive concepts will now be described more fully hereinafter with reference to the accompanying drawings, in which example embodiments are shown. The same reference numerals are used to denote the same elements in the drawings, and repeated descriptions thereof are omitted.

The inventive concepts may, however, be embodied in different forms and should not be construed as limited to the example embodiments set forth herein. Rather, these example embodiments are provided so that this disclosure is thorough and complete and fully conveys the scope of the invention to one skilled in the art.

It will be understood that, although the terms first, second, etc. may be used herein to describe various elements, components, regions, layers and/or sections, these elements, components, regions, layers and/or sections should not be limited by these terms. These terms do not refer to specific orders, up/down positions, or superiority/inferiority but are only used to distinguish one element, component, region, layer or section from another region, layer or section. Thus, a first element, component, region, layer or section discussed below could be termed a second element, component, region, layer or section without departing from the teachings of the inventive concepts.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic layout of a semiconductor device according to an example embodiment of the inventive concepts. FIGS. 2A through 2D are cross-sectional views of some elements of the semiconductor device illustrated in FIG. 1.

Figure 2A:
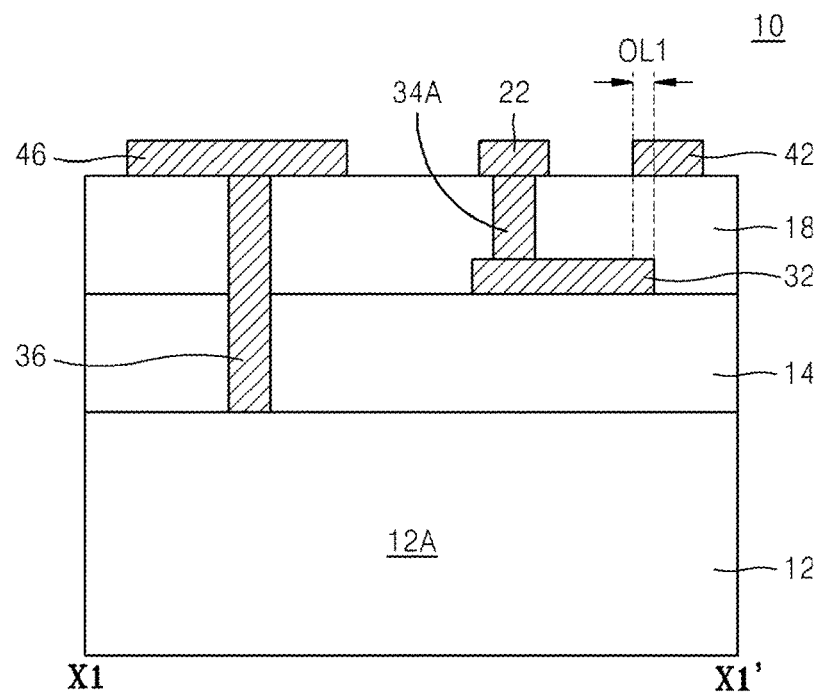
FIGS. 2A through 2D are cross-sectional views of some elements of the semiconductor device illustrated in FIG. 1.
Figure 2B:
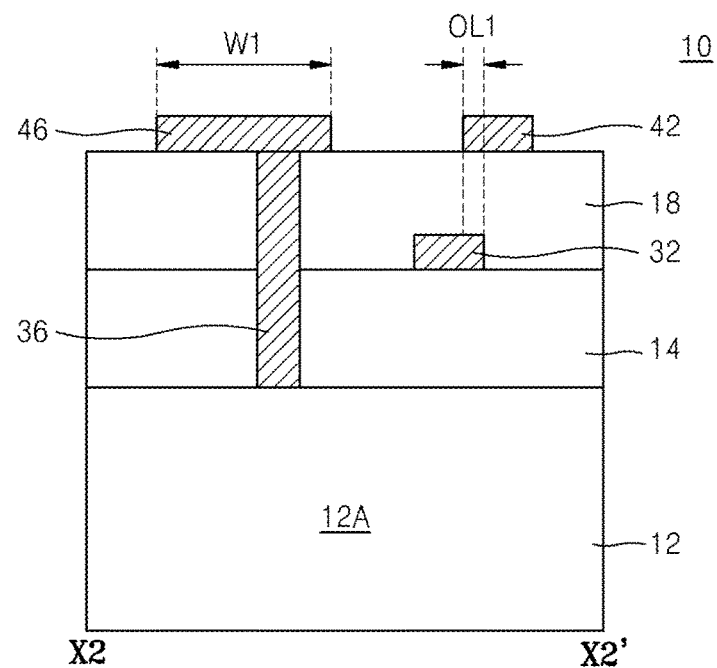
Figure 2C:
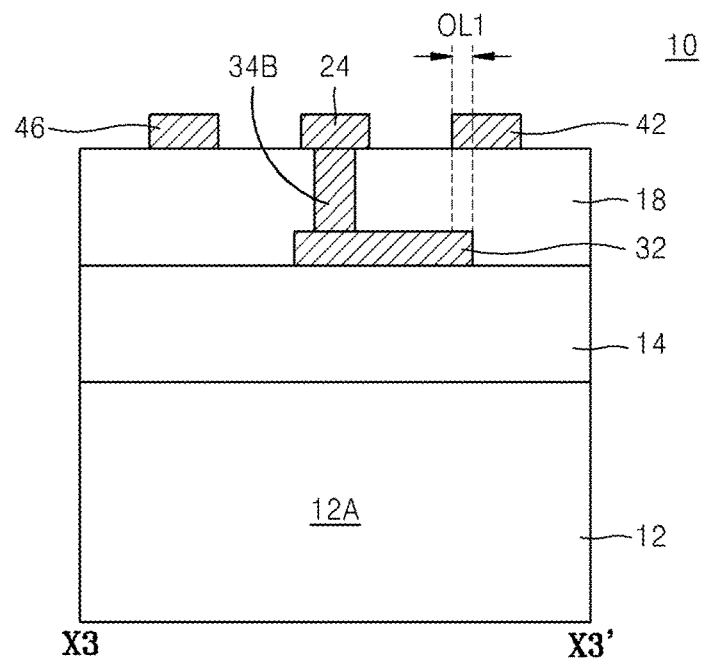
Figure 2D:
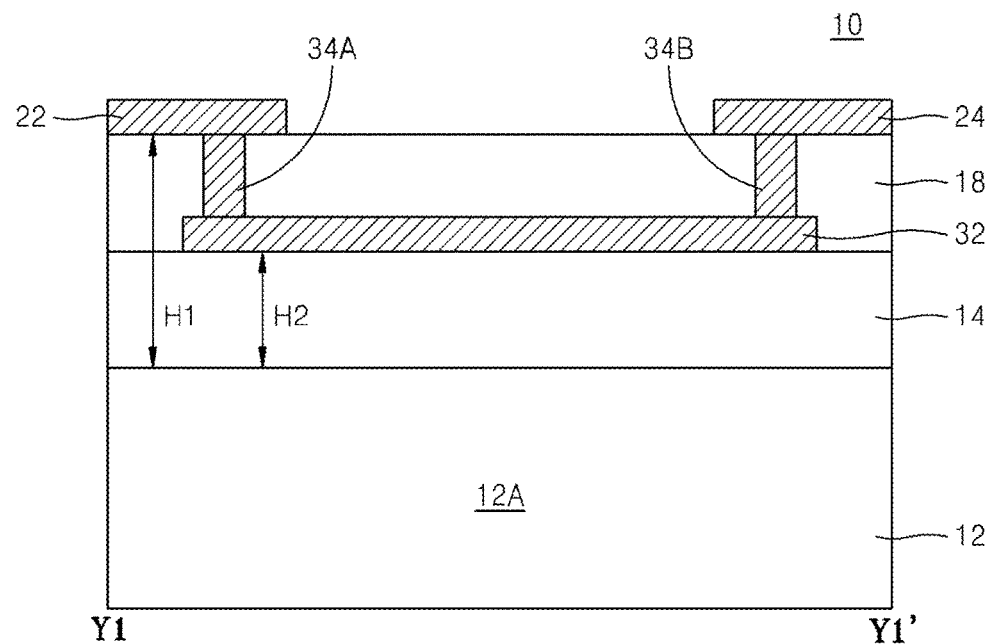

FIG. 2A is a cross-sectional view taken along a line X1-X1' of FIG. 1, FIG. 2B is a cross-sectional view taken along a line X2-X2' of FIG. 1, FIG. 2C is a cross-sectional view taken along a line X3-X3' of FIG. 1, and FIG. 2D is a cross-sectional view taken along a line Y1-Y1' of FIG. 1.

Referring to FIG. 1 and FIGS. 2A through 2D, a semiconductor device 10 includes first and second interconnection lines 22 and 24 and a bypass interconnection line 32. The first interconnection line 22 and the second interconnection line 24 extend apart from each other on a first plane apart from a substrate 12 by a first vertical distance H1. The bypass interconnection line 32 extends on a second plane apart from the substrate 12 by a second vertical distance H2. The first plane and the second plane are parallel to the substrate 12.

The bypass interconnection line 32 is formed on a first insulating layer 14 formed on the substrate 12. The first interconnection line 22 and the second interconnection line 24 are formed on a second insulating layer 18 formed on the first insulating layer 14 and the bypass interconnection line 32.

In FIGS. 2A through 2D, as an example, the second vertical distance H2 from the substrate 12 to the second plane is smaller than the first vertical distance H1 from the substrate 12 to the first plane. That is, the bypass interconnection line 32 is formed at a lower level than the first interconnection line 22 and the second interconnection line 24 on the substrate 12.

However, the inventive concepts are not limited thereto. For example, as will be described later with reference to FIGS. 3A through 3D, the bypass interconnection line 32 may be formed at a higher level than the first interconnection line 22 and the second interconnection line 24 on the substrate 12.

The first and second interconnection lines 22 and 24 and the bypass interconnection line 32 are connected to each other via a plurality of contact plugs 34A and 34B penetrating the second insulating layer 18.

The plurality of contact plugs 34A and 34B includes a first contact plug 34A connected between the first interconnection line 22 and the bypass interconnection line 32 and a second contact plug 34B connected between the second interconnection line 24 and the bypass interconnection line 32. The first contact plug 34A and the second contact plug 34B each may extend in a direction perpendicular to the direction of the main surface of the substrate 12.

The first interconnection line 22 and the second interconnection line 24 each include contact regions 22C and 24C that vertically overlap with the bypass interconnection line 32. The first contact plug 34A and the second contact plug 34B are connected to the contact region 22C of the first interconnection line 22 and the contact region 24C of the second interconnection line 24, respectively, and connect the first interconnection line 22 and the second interconnection line 24 via the bypass interconnection line 32.

At least a portion of the first interconnection line 22 and at least a portion of the second interconnection line 24 may collinearly extend on the second insulating layer 18. In some example embodiments, at least a portion of the first interconnection line 22 and at least a portion of the second interconnection line 24 may extend in different directions.

A third interconnection line 42 and a fourth interconnection line 46, which extend parallel to the first interconnection line 22 and the second interconnection line 24, respectively, are formed on the second insulating layer 18. The third interconnection line 42 and the fourth interconnection line 46 each may be disposed on the same plane like the first interconnection line 22 and the second interconnection line 24. The third interconnection line 42 and the fourth interconnection line 46 may extend apart from the first interconnection line 22 and the second interconnection line 24 on the first plane on the second insulating layer 18. In some example embodiments, at least one of the third interconnection line 42 and the fourth interconnection line 46 may include a portion that vertically overlaps with the bypass interconnection line 32. For example, as illustrated in FIG. 1 and FIGS. 2A through 2D, the third interconnection line 42 may include a portion OL1 that vertically overlaps with the bypass interconnection line 32. In some other example embodiments, other interconnection lines adjacent to the first and second interconnection lines 22 and 24 on the second insulating layer 18 may not include a portion that vertically overlaps with the bypass interconnection line 32.

The fourth interconnection line 46 is directly connected to a direct contact plug 36 that penetrates the first insulating layer 14 and the second insulating layer 18 and contacts an active region 12A of the substrate 12. The bypass interconnection line 32 is spaced apart from the direct contact plug 36.

The direct contact plug 36 may have an upper surface on the same plane as the upper surfaces of the first and second contact plugs 34A and 34B.

The bypass interconnection line 32 is not connected to the direct contact plug 36 contacting the active region 12A of the substrate 12. In some example embodiments, at least one of the first interconnection line 22 and the second interconnection line 24, which are connected to the bypass interconnection line 32 via the first contact plug 34A and the second contact plug 34B, respectively, may be connected to the active region 12A via another contact plug at a position spaced apart from the bypass interconnection line 32.

The fourth interconnection line 46 includes a contact region 46C contacting the direct contact plug 36. The contact region 46C of the fourth interconnection line 46 has a width W1 that is larger than that of the other region of the fourth interconnection line 46 such that the fourth interconnect line 46 may form a non-linear interconnect line.

When it is desired to connect the first interconnection line 22 to the second interconnection line 24 at the same level, an interconnection portion may include a large number of bent portions to connect the first interconnection line 22 to the second interconnection line 24 via a path bypassing the contact region 46C around the contact region 46C of the fourth interconnection line 46, which contacts the direct contact plug 36. Similarly, other interconnection lines adjacent to the first and second interconnection lines 22 and 24 may also be connected via a bypass around the contact region 46C of the fourth interconnection line 46, which contacts the direct contact plug 36. Thus, each of the other interconnection lines includes a large number of bent portions. Therefore, an area used to arrange a plurality of interconnection lines on the substrate 12 may increase, and a design margin for arranging a plurality of interconnection lines within a given area may decrease.

In one or more example embodiments of the inventive concept, the first interconnection line 22 and the second interconnection line 24 are connected to each other by using the bypass interconnection line 32 that is formed at a level different from that of the first and second interconnection lines 22 and 24 around the contact region 46C of the fourth interconnection line 46, which contacts the direct contact plug 36. Thus, an interconnection design margin may be secured compared to the case in which the first interconnection line 22 and the second interconnection line 24 are connected to each other at the same level. In addition, a chip size may be reduced by implementing an interconnection layout that may increase or maximize the integration density of a semiconductor device including a structure in which a plurality of interconnection lines are connected.

Figure 3A:
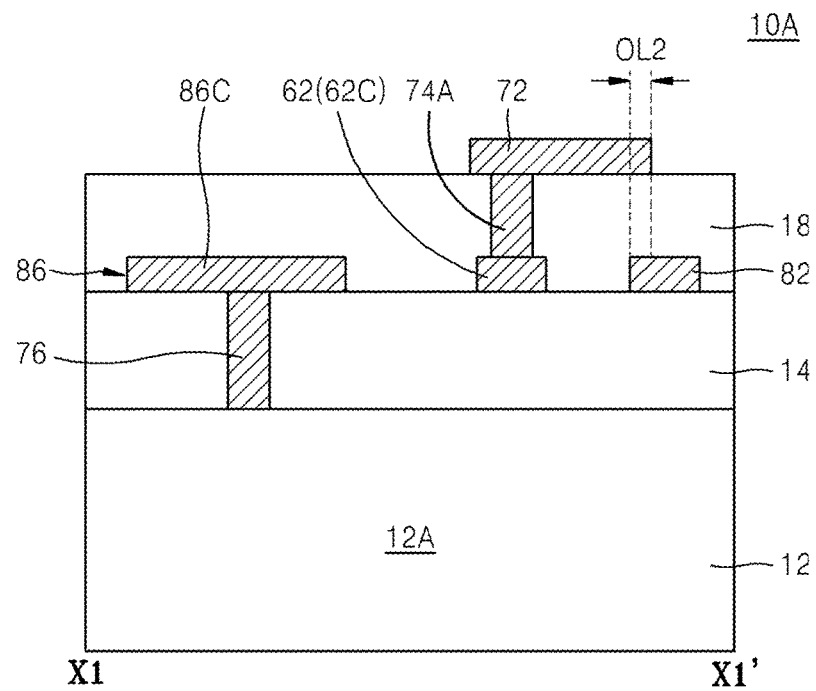
FIGS. 3A through 3D are cross-sectional views of some elements of a semiconductor device according to another example embodiment of the inventive concepts.
Figure 3B:
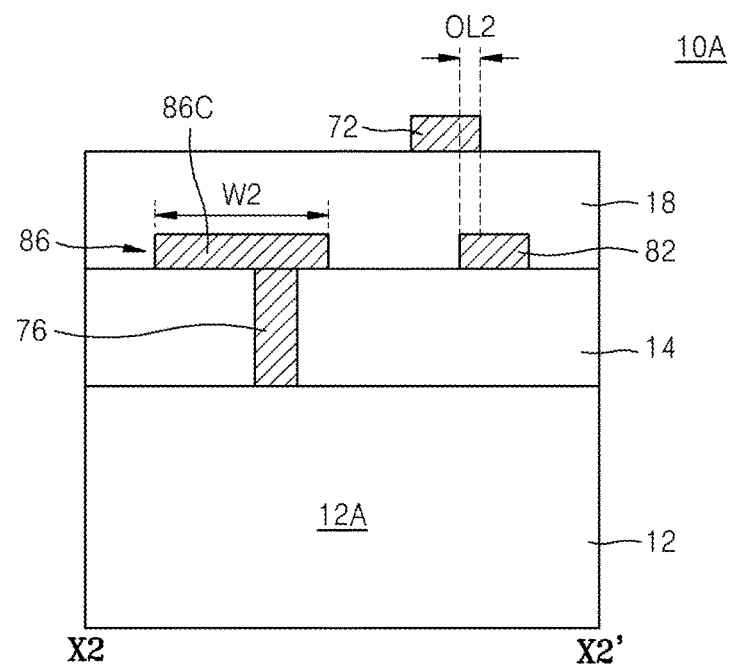
Figure 3C:
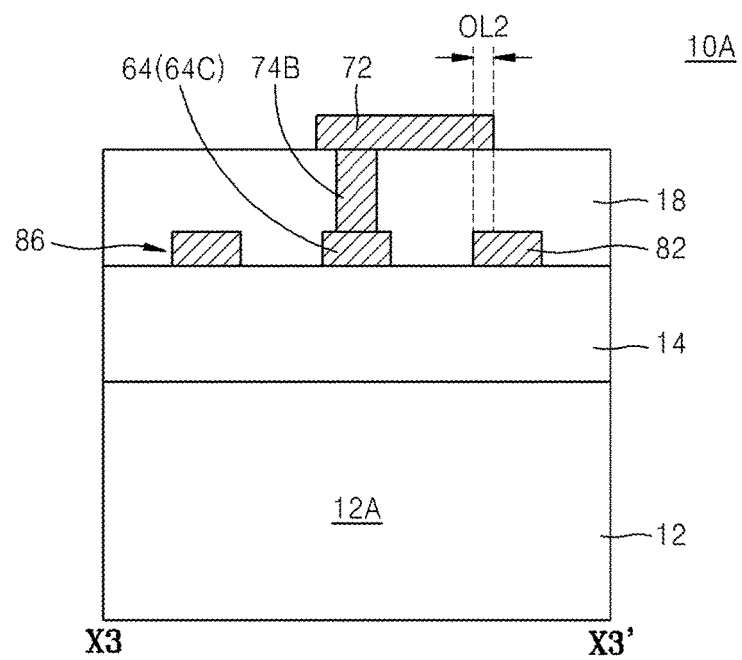
Figure 3D:
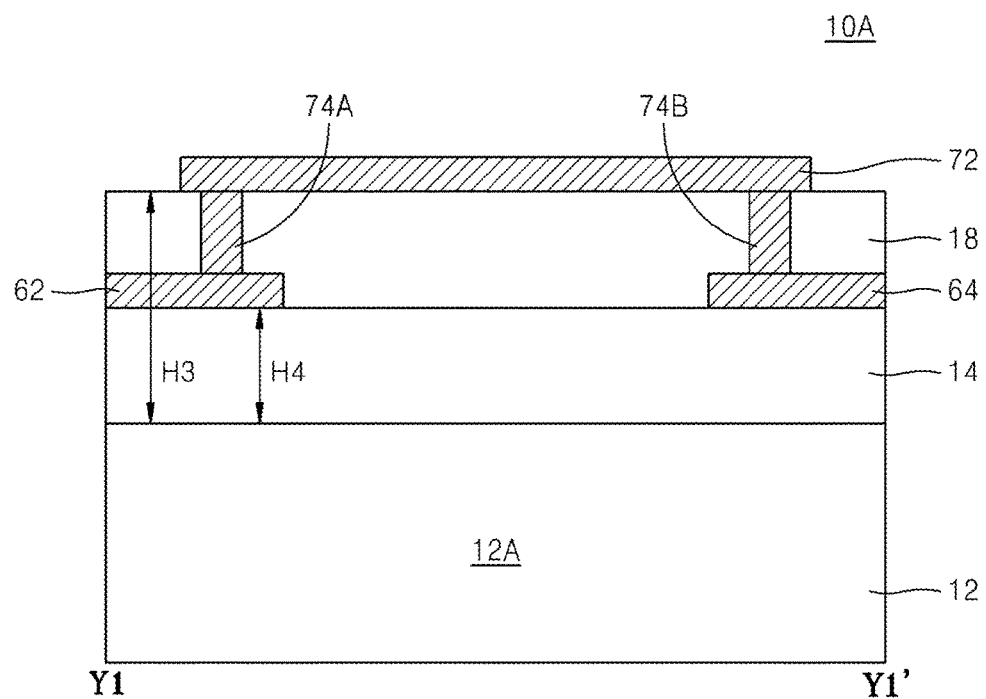

FIGS. 3A through 3D are cross-sectional views of some elements of a semiconductor device according to another example embodiment of the inventive concepts. In FIGS. 3A through 3D, the same elements as in FIGS. 2A through 2D are denoted by the same reference numerals, and thus, detailed descriptions thereof are omitted. FIG. 3A may correspond to a cross-sectional view taken along the line X1-X1' of FIG. 1, FIG. 3B may correspond to a cross-sectional view taken along the line X2-X2' of FIG. 1, FIG. 3C may correspond to a cross-sectional view taken along the line X3-X3' of FIG. 1, and FIG. 3D may correspond to a cross-sectional view taken along the line Y1-Y1' of FIG. 1.

As illustrated in FIGS. 3A through 3D, a semiconductor device 10A has a layout that is substantially the same as that of the semiconductor device 10 of FIG. 1. However, unlike in the semiconductor device 10 illustrated in FIGS. 2A through 2D, a bypass interconnection line 72 extends on a third plane spaced apart from a substrate 12 by a third vertical distance H3, and a first interconnection line 62 and a second interconnection line 64, which are connected to each other via the bypass interconnection line 72, each extend on a fourth plane spaced apart from a substrate 12 by a fourth vertical distance H4, wherein the fourth vertical distance H4 is smaller than the third vertical distance H3. That is, the first interconnection line 62 and the second interconnection line 64 are formed between a first insulating layer 14 and a second insulating layer 18, and the bypass interconnection line 72 is formed on the second insulating layer 18 covering the first interconnection line 62, the second interconnection line 64, and the first insulating layer 14. Thus, the bypass interconnection line 72 is formed at a higher level than the first and second interconnection lines 62 and 64 on the substrate 12.

The first and second interconnection lines 62 and 64 and the bypass interconnection line 72 are connected to each other via a plurality of contact plugs 74A and 74B.

The plurality of contact plugs 74A and 74B penetrating the second insulating layer 18 includes a first contact plug 74A connected between the first interconnection line 62 and the bypass interconnection line 72 and a second contact plug 74B connected between the second interconnection line 64 and the bypass interconnection line 72. The first contact plug 74A and the second contact plug 74B each may extend in a direction perpendicular to the direction in which a main surface of the substrate 12 extends.

The first interconnection line 62 and the second interconnection line 64 each include contact regions 62C and 64C that vertically overlap with the bypass interconnection line 72. The first contact plug 64A and the second contact plug 64B are connected to the contact region 62C of the first interconnection line 62 and the contact region 64C of the second interconnection line 64, respectively, and connect the first interconnection line 62 and the second interconnection line 64 via the bypass interconnection line 72.

Other details of the first and second interconnection lines 62 and 64 are similar to those of the first and second interconnection lines 22 and 24 described with reference to FIGS. 2A through 2D.

A third interconnection line 82 and a fourth interconnection line 86, which extend parallel to the first interconnection line 62 and the second interconnection line 64, respectively, are formed on the first insulating layer 14.

In some example embodiments, at least one of the third interconnection line 82 and the fourth interconnection line 86 may include a portion that vertically overlaps with the bypass interconnection line 72. For example, as illustrated in FIGS. 3A through 3D, the third interconnection line 82 includes a portion OL2 that vertically overlaps with the bypass interconnection line 72. In some other example embodiments, other interconnection lines disposed to be adjacent to the first and second interconnection lines 62 and 64 on the same plane may not include a portion that vertically overlaps with the bypass interconnection line 72.

The fourth interconnection line 86 is directly connected to a direct contact plug 76 that penetrates the first insulating layer 14 and contacts an active region 12A of the substrate 12. The bypass interconnection line 72 is spaced apart from the direct contact plug 76. The bypass interconnection line 72 is not connected to the direct contact plug 76 contacting the active region 12A of the substrate 12.

The fourth interconnection line 86 includes a contact region 86C contacting the direct contact plug 76. The contact region 86C of the fourth interconnection line 86 has a width W2 that is larger than that of the other region of the fourth interconnection line 86.

Detailed descriptions of the third and fourth interconnection lines 82 and 86 are similar to those of the third and fourth interconnection lines 42 and 46 illustrated in FIGS. 2A through 2D.

In embodiment example of the inventive concepts, the first interconnection line 62 and the second interconnection line 64 may be connected to each other by using the bypass interconnection line 72 that is formed at a different level from the first and second interconnection lines 62 and 64 around the contact region 86C of the fourth interconnection line 86, which contacts the direct contact plug 76. Thus, an interconnection design margin may be secured compared to the case in which the first interconnection line 62 and the second interconnection line 64 are connected to each other at the same level. In addition, a chip size may be reduced by implementing an interconnection layout that may increase or maximize the integration density of a semiconductor device including a structure in which a plurality of interconnection lines are connected.

FIGS. 4A through 7B are cross-sectional views illustrated according to a process sequence to explain a method of manufacturing a semiconductor device, according to example embodiments of the inventive concepts. In FIGS. 4A through 7B, a method of manufacturing the semiconductor device 10 illustrated in FIGS. 2A through 2D is explained as an example, however, example embodiments are not limited thereto. For example, a similar method may be applied to manufacturer the semiconductor device 10A illustrated in FIGS. 3A through 3D.

FIG. 4A, FIG. 5A, FIG. 6A, and FIG. 7A each illustrates a portion corresponding to a cross-section taken along the line X1-X1' of FIG. 1, and FIG. 4B, FIG. 5B, FIG. 6B, and FIG. 7B each illustrates a portion corresponding to a cross-section taken along the line Y1-Y1' of FIG. 1. In FIGS. 1 through 2D and FIGS. 4A through 7B, the same elements are denoted by the same reference numerals, and thus, repeated descriptions are omitted.

Figure 4A:
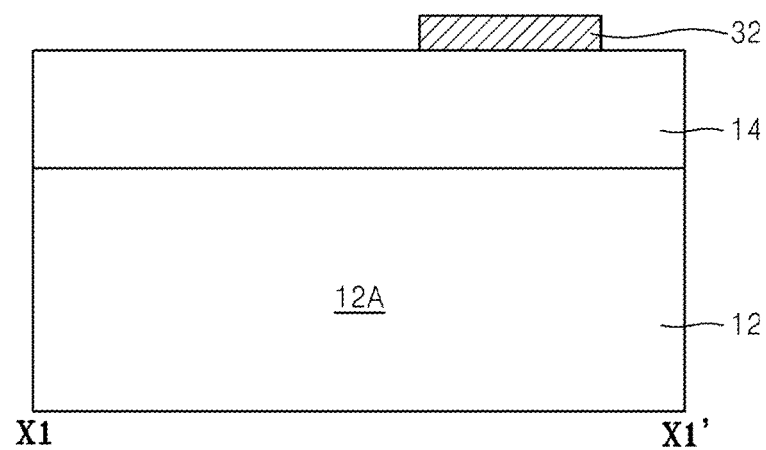
FIGS. 4A through 7B are cross-sectional views according to a process sequence to explain a method of manufacturing a semiconductor device, according to example embodiments of the inventive concepts.
Figure 4B:
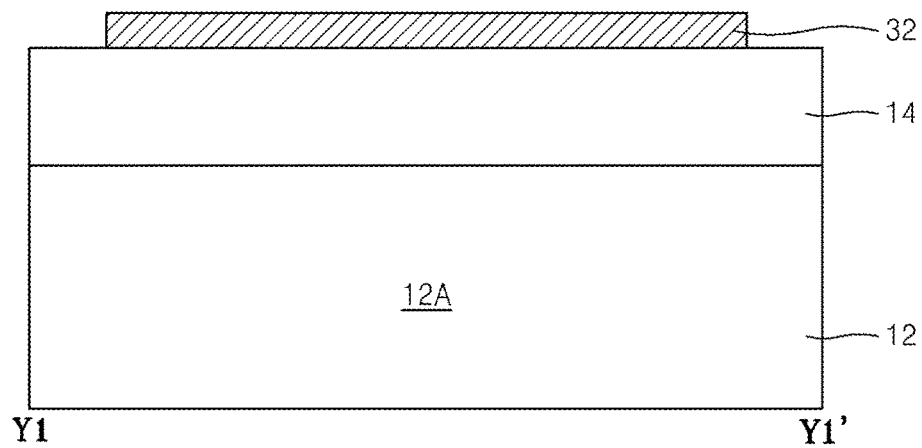

Referring to FIGS. 4A and 4B, a first insulating layer 14 is formed on a substrate 12, and a bypass interconnection line 32 is formed on the first insulating layer 14.

In some example embodiments, the substrate 12 is a semiconductor wafer. In some example embodiments, the substrate 12 includes silicon (Si). In other example embodiments, the substrate 12 may include a semiconductor, such as germanium (Ge), or a compound semiconductor, such as silicon carbide (SiC), gallium arsenide (GaAs), indium arsenide (InAs), or indium phosphide (InP). In at least one example embodiment, the substrate 12 may have a silicon on insulator (SOI) structure. For example, the substrate 12 may include a buried oxide layer (BOX). In some example embodiments, the substrate 12 may include a conductive region, for example, a well doped with impurities or a structure doped with impurities. Also, the substrate 12 may have various device isolation structures, such as a shallow trench isolation (STI) structure and the like.

Various kinds of plurality of individual devices may be formed on the substrate 12. The plurality of individual devices may include various microelectronic devices, e.g., a metal-oxide-semiconductor field effect transistor (MOSFET), a system large scale integration (system LSI), an image sensor such as a CMOS image sensor (CIS), a micro-electro-mechanical system (MEMS), an active device, a passive device, and the like. The plurality of individual devices may be electrically connected to the active region 12A of the substrate 12. Also, the plurality of individual devices each may be electrically isolated from adjacent other individual devices by the first insulating layer 14.

The first insulating layer 14 may include an oxide layer, a nitride layer, a carbide layer, a polymer layer, or a combination thereof. However, example embodiments of the inventive concepts are not limited thereto.

The bypass interconnection line 32 includes a conductive layer. In some embodiments, the bypass interconnection line 32 may include a single layer structure or multi-layered structure including at least one selected from W, WN, WC, Cu, CuSn, CuMg, CuNi, CuZn, CuPd, CuAu, CuRe, CuW, Ti, TiN, Ta, TaN, Ru, Co, Mn, WN, Ni, and NiB, or an alloy thereof. However, example embodiments of the inventive concepts are not limited thereto.

Figure 5A:
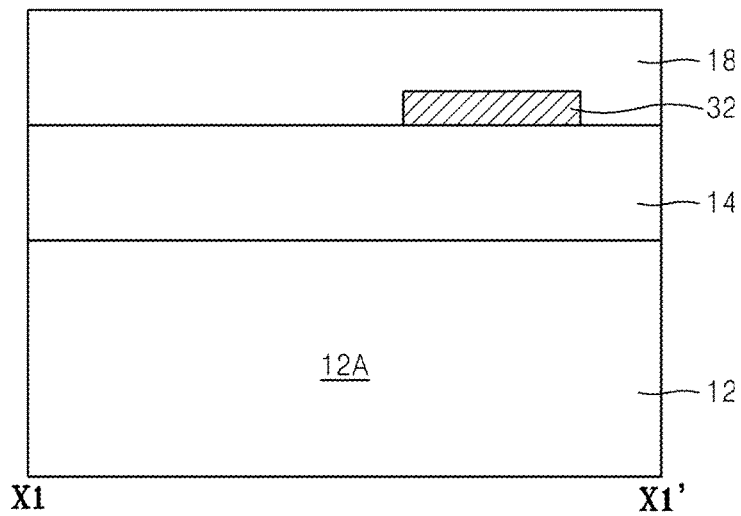
Figure 5B:
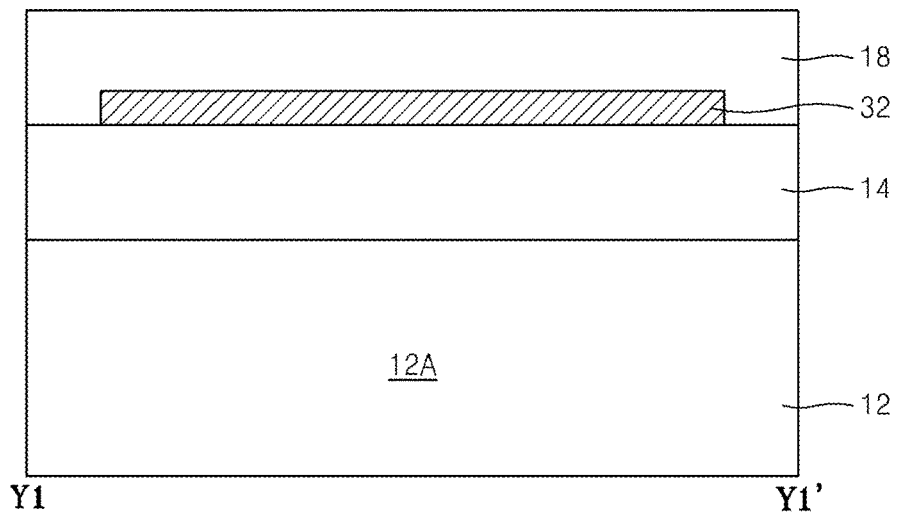

Referring to FIGS. 5A and 5B, a second insulating layer 18, which covers the first insulating layer 14 and the bypass interconnection line 32, is formed on the first insulating layer 14.

The second insulating layer 18 may include an oxide layer, a nitride layer, a carbide layer, a polymer layer, or a combination thereof. However, example embodiments of the inventive concepts are not limited thereto.

Figure 6A:
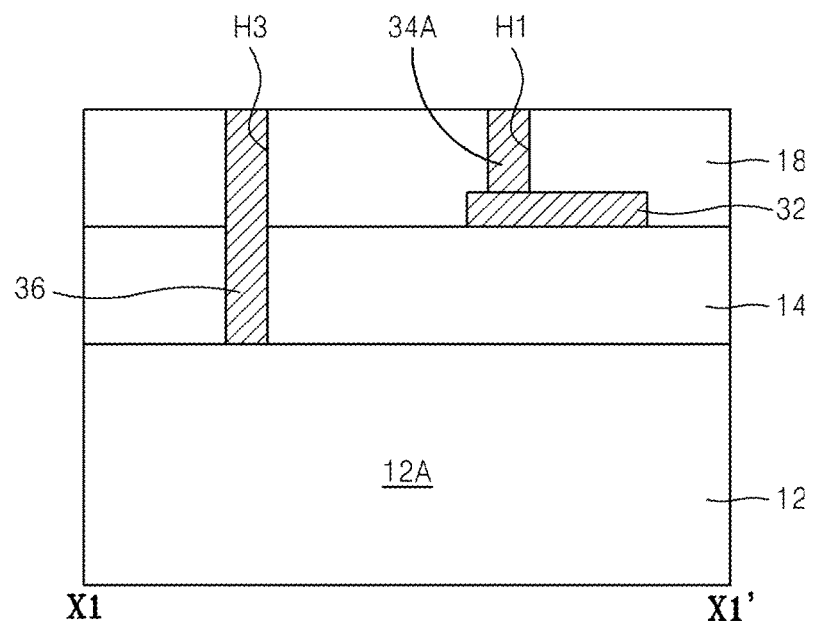
Figure 6B:
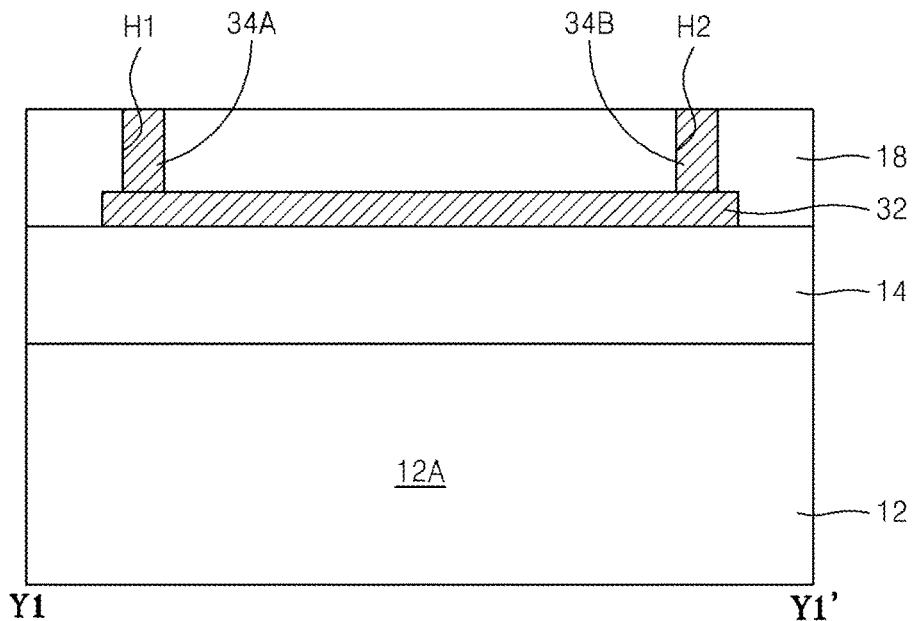

Referring to FIGS. 6A and 6B, first and second contact holes H1 and H2 exposing the bypass interconnection line 32 and a third contact hole H3 exposing the active region 12A of the substrate 12 are formed by etching some portions of the first and second insulating layers 14 and 18. A first contact plug 34A, a second contact plug 34B, and a direct contact plug 36 are formed by filling the first, second, and third contact holes H1, H2, and H3 with a conductive material. In some example embodiments, the first contact plug 34A, the second contact plug 34B, and the direct contact plug 36 may be formed simultaneously.

In some example embodiments, the first contact plug 34A, the second contact plug 34B, and the direct contact plug 36 32 each may include a single layer structure or multi-layered structure including at least one selected from W, WN, WC, Cu, CuSn, CuMg, CuNi, CuZn, CuPd, CuAu, CuRe, CuW, Ti, TiN, Ta, TaN, Ru, Co, Mn, WN, Ni, and NiB, or an alloy thereof. However, example embodiments of the inventive concepts are not limited thereto.

Figure 7A:
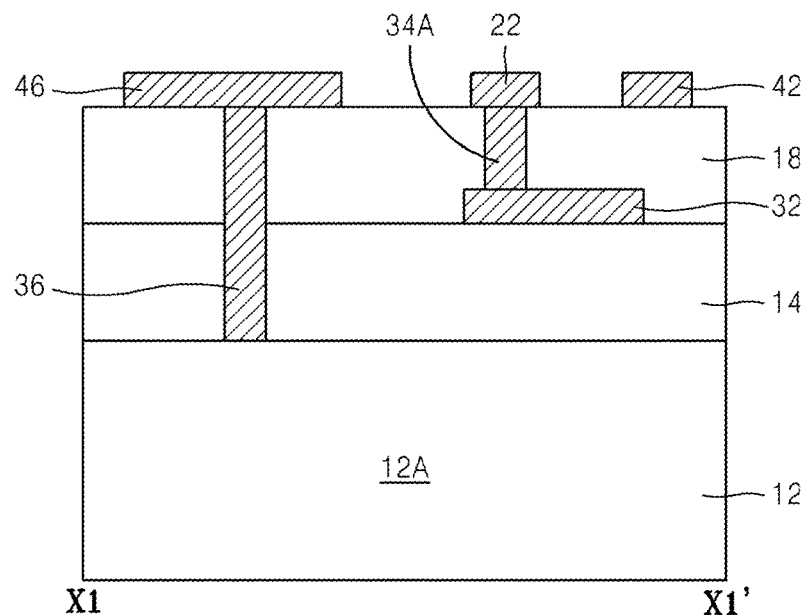
Figure 7B:
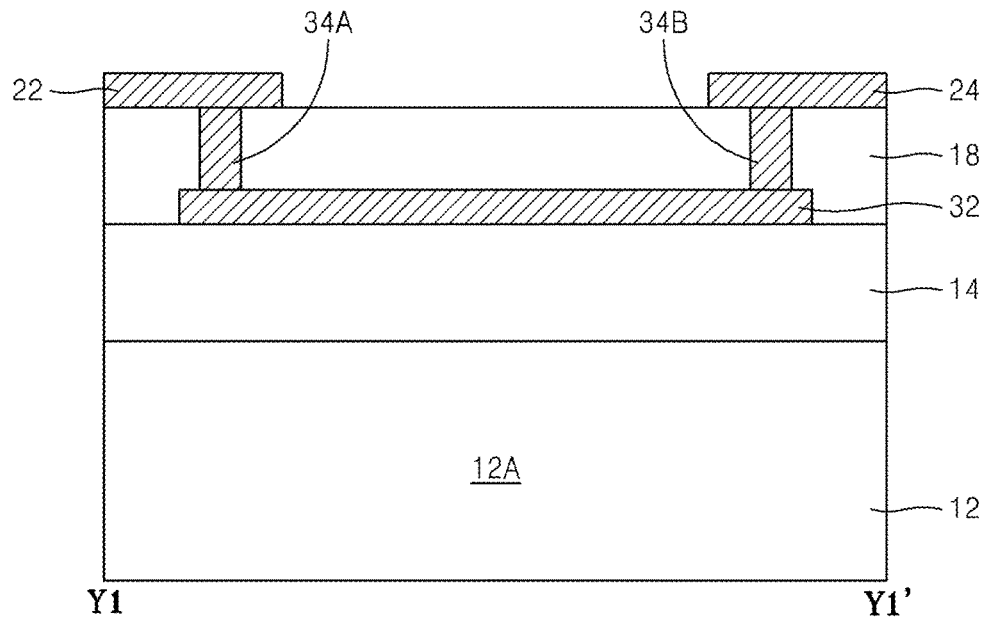

Referring to FIGS. 7A and 7B, after forming a conductive layer on the second insulating layer 18, a first interconnection line 22 that is connected to the first contact plug 34A, a second interconnection line 24 that is connected to the second contact plug 34B, a third interconnection line 42 that is disposed to be adjacent to the first and second interconnection lines 22 and 24, and a fourth interconnection line 46 that is connected to the direct contact plug 36 are formed by patterning the conductive layer.

In some embodiments, the first interconnection line 22, the second interconnection line 24, the third interconnection line 42, and the fourth interconnection line 46 each may include a single layer structure or multi-layered structure including at least one selected from W, WN, WC, Cu, CuSn, CuMg, CuNi, CuZn, CuPd, CuAu, CuRe, CuW, Ti, TiN, Ta, TaN, Ru, Co, Mn, WN, Ni, and NiB, or an alloy thereof. However, example embodiments of the inventive concepts are not limited thereto.

Although a method of manufacturing the semiconductor device 10 illustrated in FIGS. 2A through 2D is described above with reference to FIGS. 4A through 7B, the semiconductor device 10A illustrated in FIGS. 3A through 3D may be manufactured based on the descriptions of FIGS. 4A through 7B.

Figure 8:
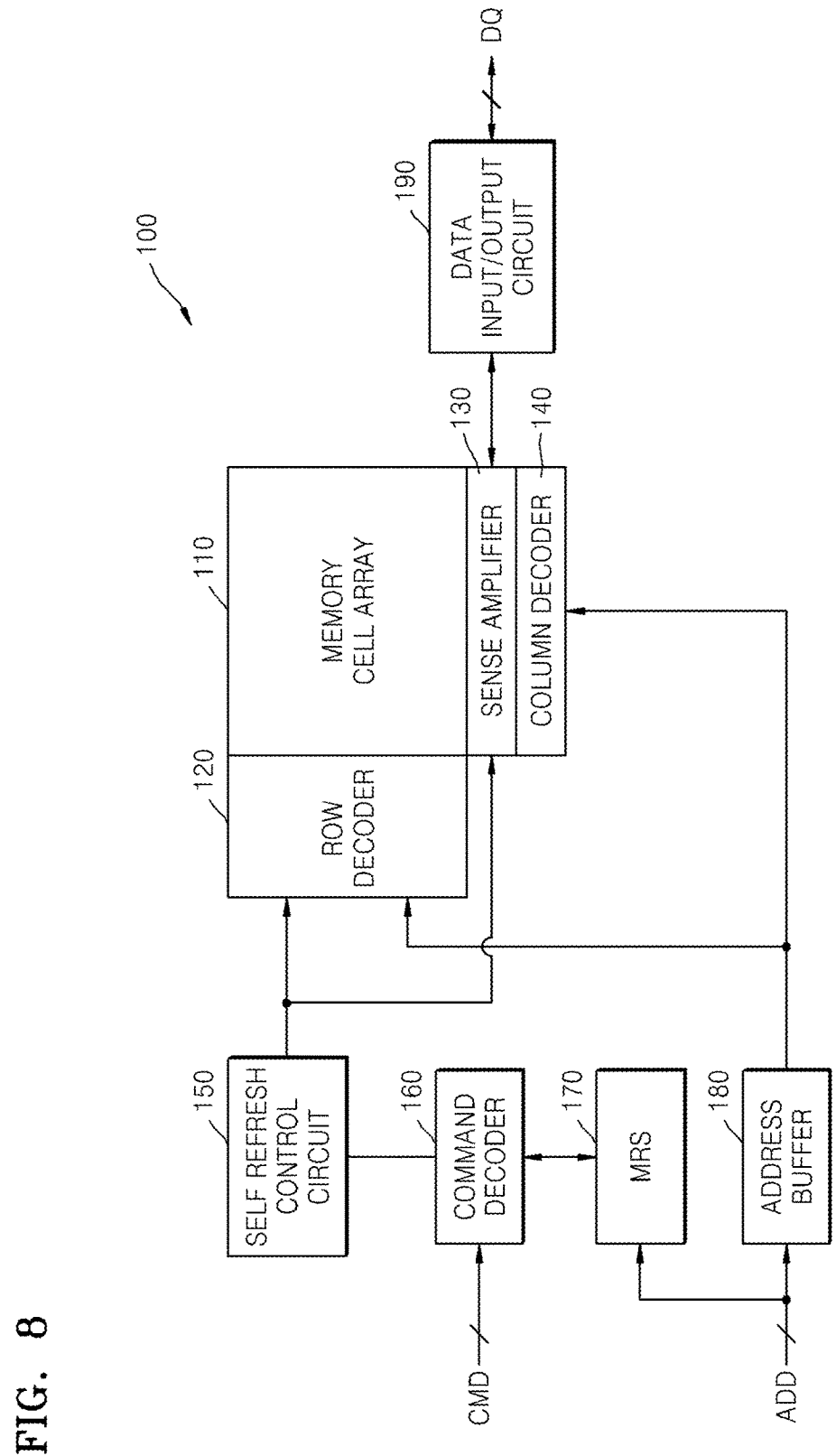
FIG. 8 is a block diagram of a semiconductor device according to an embodiment of the inventive concept.

FIG. 8 is a block diagram of a semiconductor device according to an example embodiment of the inventive concepts.

Referring to FIG. 8, a semiconductor device 100 includes a memory cell array 110, a row decoder 120, a sense amplifier 130, a column decoder 140, a self refresh control circuit 150, a command decoder 160, a mode register set/extended mode register set (MRS/EMRS) circuit 170, an address buffer 180, and a data input/output circuit 190.

In the memory cell array 110, a plurality of memory cells for storing data are arranged in a row direction and a column direction. Each of the plurality of memory cells may be formed of a cell capacitance and an access transistor. The gate of the access transistor may be connected to a corresponding word line of a plurality of word lines arranged in the row direction, one of the source and the drain of the access transistor may be connected to a bit line (BL) or complementary bit line (/BL) arranged in the column direction, and the other of the source and the drain may be connected to the cell transistor.

The sense amplifier 130 senses data of a memory cell and amplifies the sensed data, and writes the amplified data to the memory cell. The sense amplifier 130 may be a cross-coupled amplifier that is connected between a bit line BL and a complementary bit line (/BL).

Data DQ input via the data input/output circuit 190 is written to the memory cell array 110 based on an address signal ADD, and data DQ read from the memory cell array 110 based on the address signal ADD is output to the outside via the data input/output circuit 190. The address signal ADD is input to the address buffer to designate a memory cell to which data is to be written or from which data is to be read. The address buffer 180 temporally stores the address signal ADD input from the outside.

The row decoder 120 decodes a row address of the address signal ADD output from the address buffer 180 to designate a word line connected to a memory cell to which data is to be input or from which data is to be output. That is, in a data write or read mode, the row decoder 120 decodes the row address output from the address buffer 180 to enable a corresponding word line. In a self refresh mode, the row decoder 120 decodes a row address generated from an address counter to enable a corresponding word line.

The column decoder 140 decodes a column address of the address signal ADD output from the address buffer 180 to designate a bit line connected to a memory cell to which data is to be input or from which data is to be output.

The memory cell array 110 outputs data from a memory cell designated by the row address and the column address or writes data to the memory cell.

The command decoder 160 receives a command signal CMD that is applied from the outside, and decodes the command signal CMD to internally generate a decoded command signal, e.g., a self refresh entry command or a self refresh exit command.

The MRS/EMRS circuit 170 sets an internal mode register in response to an MRS/EMRS command for designating an operation mode of the semiconductor device 100 and an address signal ADD.

Although not illustrated in FIG. 8, the semiconductor device 100 may further include a clock circuit for generating a clock signal and a power circuit that receives a power supply voltage applied from the outside, generates an internal voltage, and distributes the generated internal voltage.

The self refresh control circuit 150 controls a self refresh operation of the semiconductor memory device 100 in response to a command that is output from the command decoder 160.

The command decoder 160 may include an address counter, a timer, and a core voltage generator. The address counter may generate a row address for designating a memory cell corresponding to a self refresh target in response to the self refresh entry command that is output from the command decoder 160, and may apply the generated row address to the row decoder 120. The address counter may discontinue a counting operation in response to the self refresh exit command that is output from the command decoder 160.

The memory cell array 110 and the sense amplifier 130 may form a memory core unit.

Figure 9:
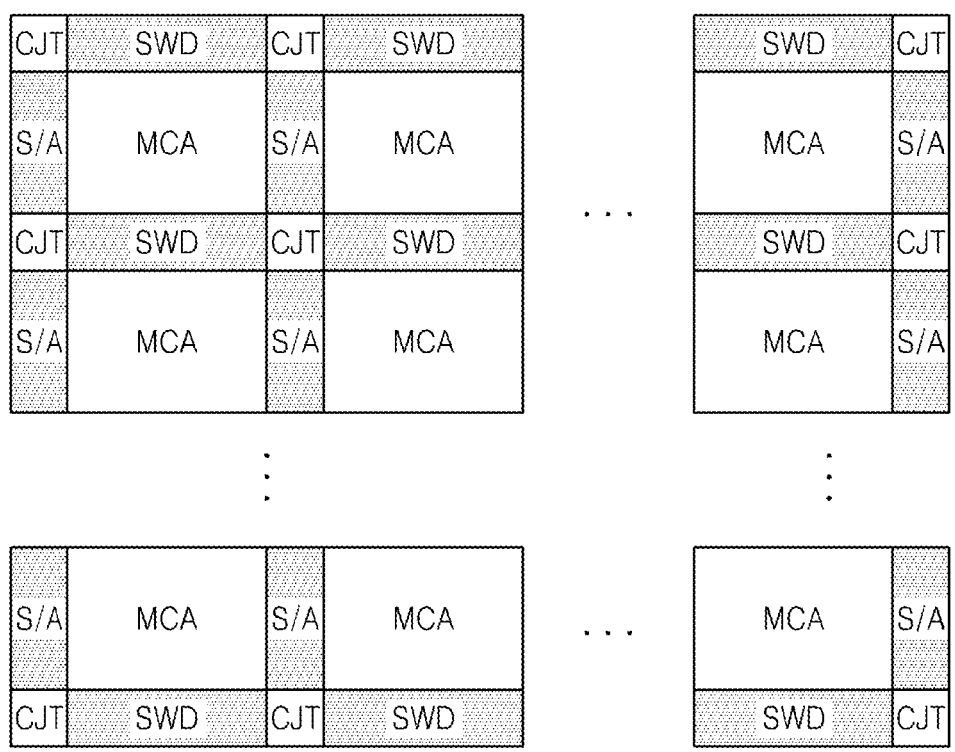
FIG. 9 is a diagram illustrating a layout of a memory core unit including a memory cell array and a sense amplifier illustrated in FIG. 8.

FIG. 9 is a diagram illustrating a layout of a memory core unit 132 including the memory cell array 110 and the sense amplifier 130, illustrated in FIG. 8.

Referring to FIG. 9, the memory core unit 132 may include a plurality of memory cell array blocks MCA. The plurality of memory cell array blocks MCA may form the memory cell array 110 of FIG. 8.

A plurality of sub-word line driver blocks SWD may be arranged in the direction of word lines of the memory cell array blocks MCA, and a plurality of sense amplifier blocks S/A may be arranged in the direction of bit lines of the memory cell array blocks MCA. A plurality of sense amplifiers are disposed in each of the plurality of sense amplifier blocks S/A.

A conjunction block CJT may be arranged at an intersection of each sub-word line driver block SWD with each sense amplifier block S/A. Power drivers and ground drivers for driving bit line sense amplifiers may be alternately disposed in the conjunction block CJT.

Figure 10:
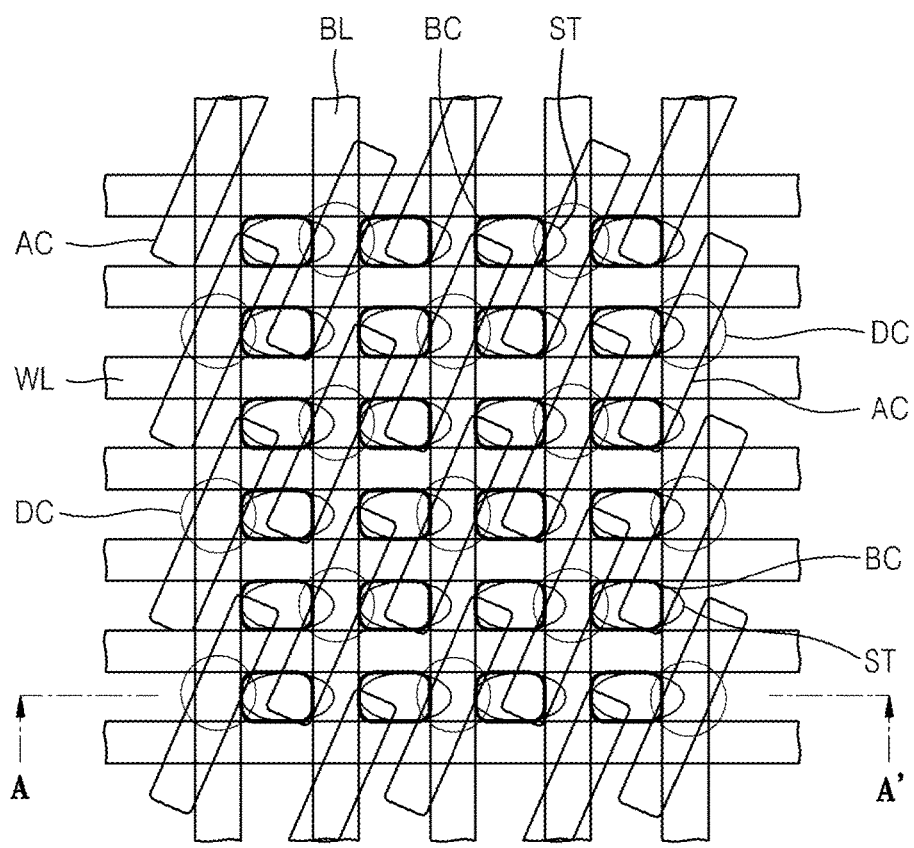
FIG. 10 is an example layout of some elements of a memory cell array illustrated in FIG. 8.

FIG. 10 is an example plane layout of some elements of the memory cell array 110 illustrated in FIG. 8. The layout illustrated in FIG. 10 may correspond to the configuration of the memory cell array block MCA of FIG. 9.

In some example embodiments, the layout of the memory cell array 110 illustrated in FIG. 10 is applicable to a memory cell having a unit cell size of $6F^2$ in a semiconductor memory device, where "F" denotes a minimum lithographic feature size.

Referring to FIG. 10, the memory cell array 110 includes a plurality of active regions AC. A plurality of word lines WL run across the plurality of active regions AC and extend parallel to one another in a first direction (i.e., the X direction of FIG. 10). The plurality of word lines WL may be disposed at regular intervals. A plurality of bit lines BL are disposed on the plurality of word lines WL and extend parallel to one another in a second direction (i.e., the Y direction of FIG. 10) orthogonal to the first direction.

The plurality of bit lines BL are connected to the plurality of active regions AC via a plurality of direct contacts DC.

In some embodiments, the plurality of bit lines BL may be disposed parallel to one another at a pitch of 3F. In some embodiments, the plurality of word lines WL may be disposed parallel to one another at a pitch of 2F.

A plurality of buried contacts BC may be formed of a contact structure extending from an area between two adjacent bit lines BL of the plurality of bit lines BL to the top of any one of the two adjacent bit lines. In some embodiments, the plurality of buried contacts BC may be arranged in a line in the first direction and the second direction. In some embodiments, the plurality of buried contacts BC may be disposed at regular intervals in the second direction. Each of the plurality of buried contacts BC may electrically connect a lower electrode ST of a capacitor to the active region AC.

Figure 11A:
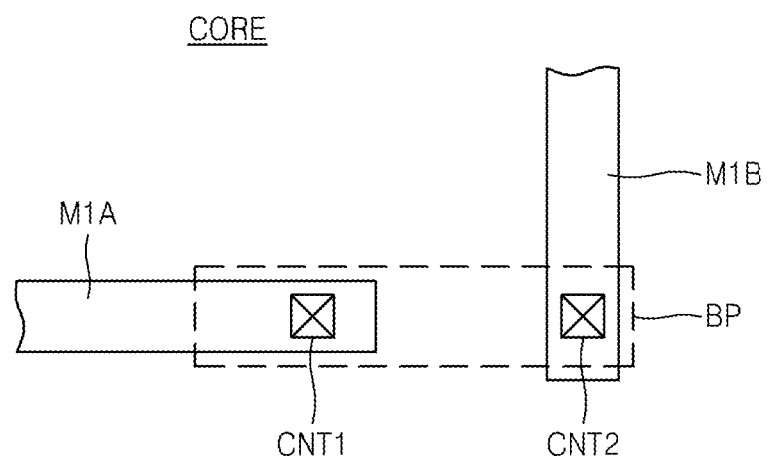
FIGS. 11A and 11B are layouts illustrating interconnection structures forming circuits that are disposed in a core area around a memory cell array of the semiconductor device illustrated in FIG. 8.
Figure 11B:
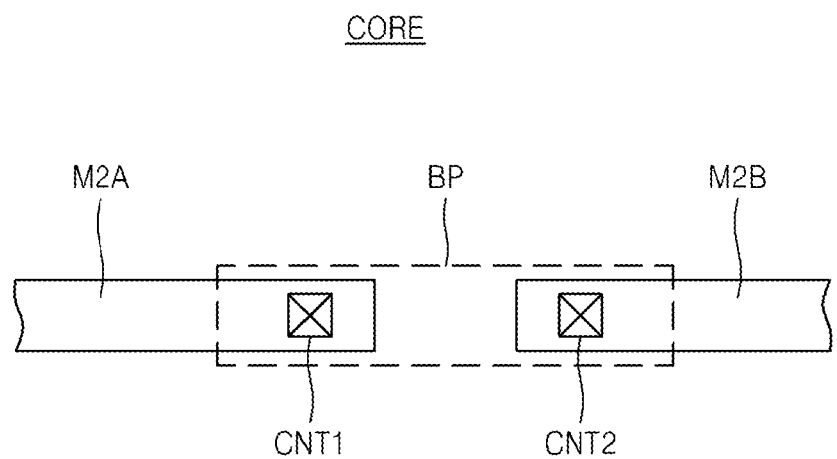

FIGS. 11A and 11B are layouts illustrating interconnection structures forming circuits (e.g., the sense amplifier 130) that are disposed in a core area CORE around the memory cell array 110 of the semiconductor device 100 illustrated in FIG. 8.

The interconnection structures illustrated in FIGS. 11A and 11B may also be applied to the row decoder 120, sense amplifier 130, and column decoder 140 of FIG. 8 and the sub-word line driver block SWD and sense amplifier block S/A of FIG. 9.

Referring to FIG. 11A, an interconnection structure, which includes a first interconnection line M1A and a second interconnection line M1B which are spaced apart from each other and extend in different directions, may be formed in the core area CORE of the semiconductor device 100.

The first interconnection line M1A and the second interconnection line M1B may extend apart from each other on a first plane. A bypass interconnection line BP extends on a second plane different from the first plane. In some example embodiments, the bypass interconnection line BP may be disposed at a lower level than the first and second interconnection lines M1A and M1B. In other example embodiments, the bypass interconnection line BP may be disposed at a higher level than the first and second interconnection lines M1A and M1B. The first interconnection line M1A and the second interconnection line M1B are connected to the bypass interconnection line BP via a plurality of contact plugs CNT1 and CNT2.

Referring to FIG. 11B, an interconnection structure, which includes a first interconnection line M2A and a second interconnection line M2B which are spaced apart from each other and collinearly extend, may be formed in the core area CORE of the semiconductor device 100.

The first interconnection line M2A and the second interconnection line M2B may extend apart from each other on a first plane. A bypass interconnection line BP extends on a second plane different from the first plane. In some example embodiments, the bypass interconnection line BP may be disposed at a lower level than the first and second interconnection lines M2A and M2B. In other example embodiments, the bypass interconnection line BP may be disposed at a higher level than the first and second interconnection lines M2A and M2B. The first interconnection line M2A and the second interconnection line M2B are connected to the bypass interconnection line BP via a plurality of contact plugs CNT1 and CNT2.

Figure 12A:
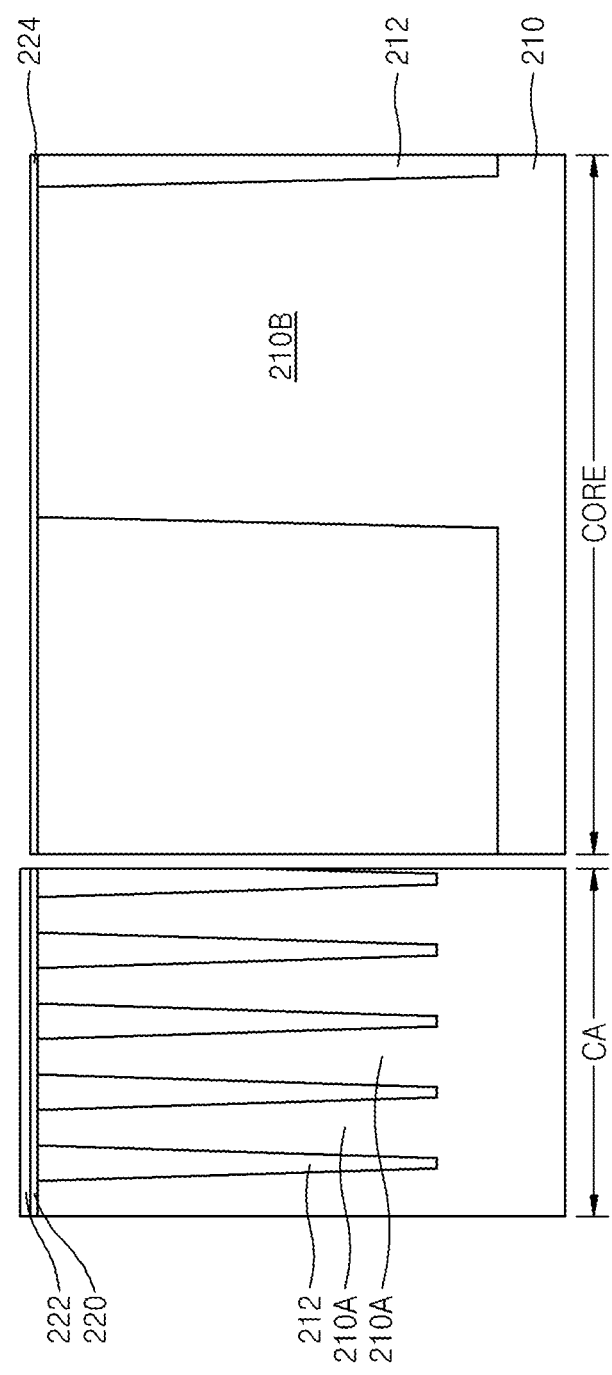
FIGS. 12A through 12N are cross-sectional views according to a process sequence to explain a method of manufacturing a semiconductor device, according to an example embodiment of the inventive concepts.
Figure 12B:
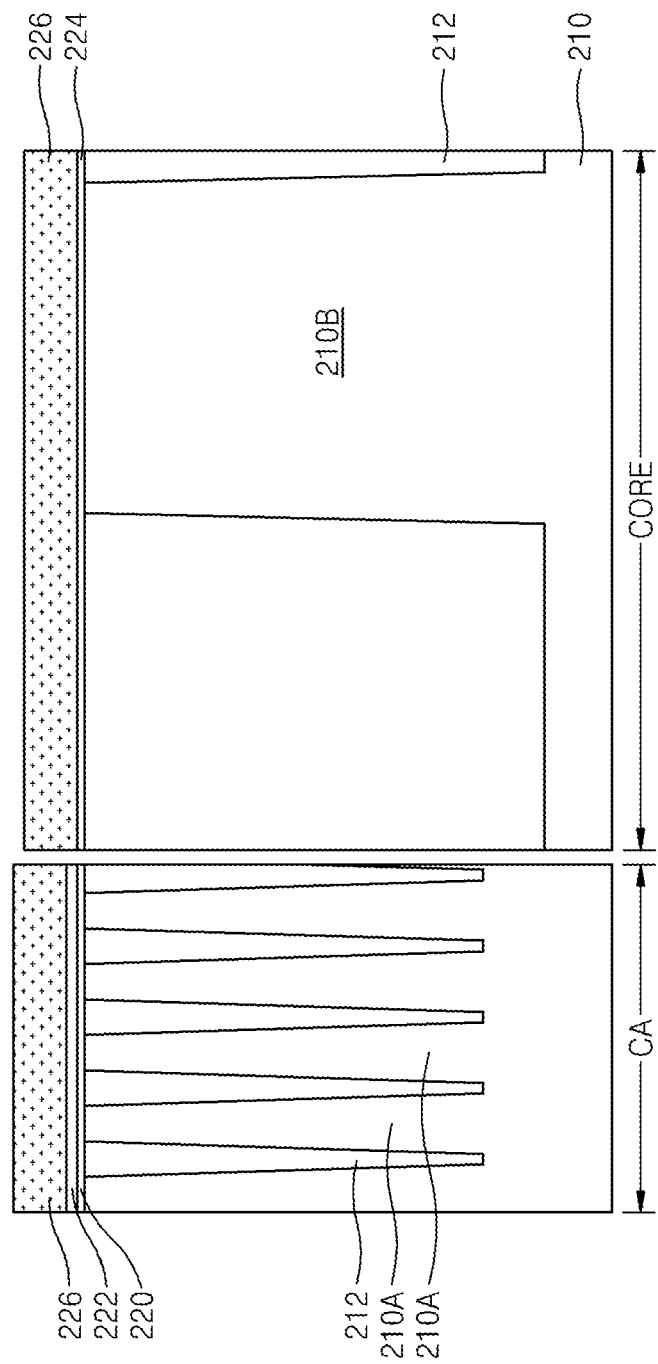
Figure 12C:
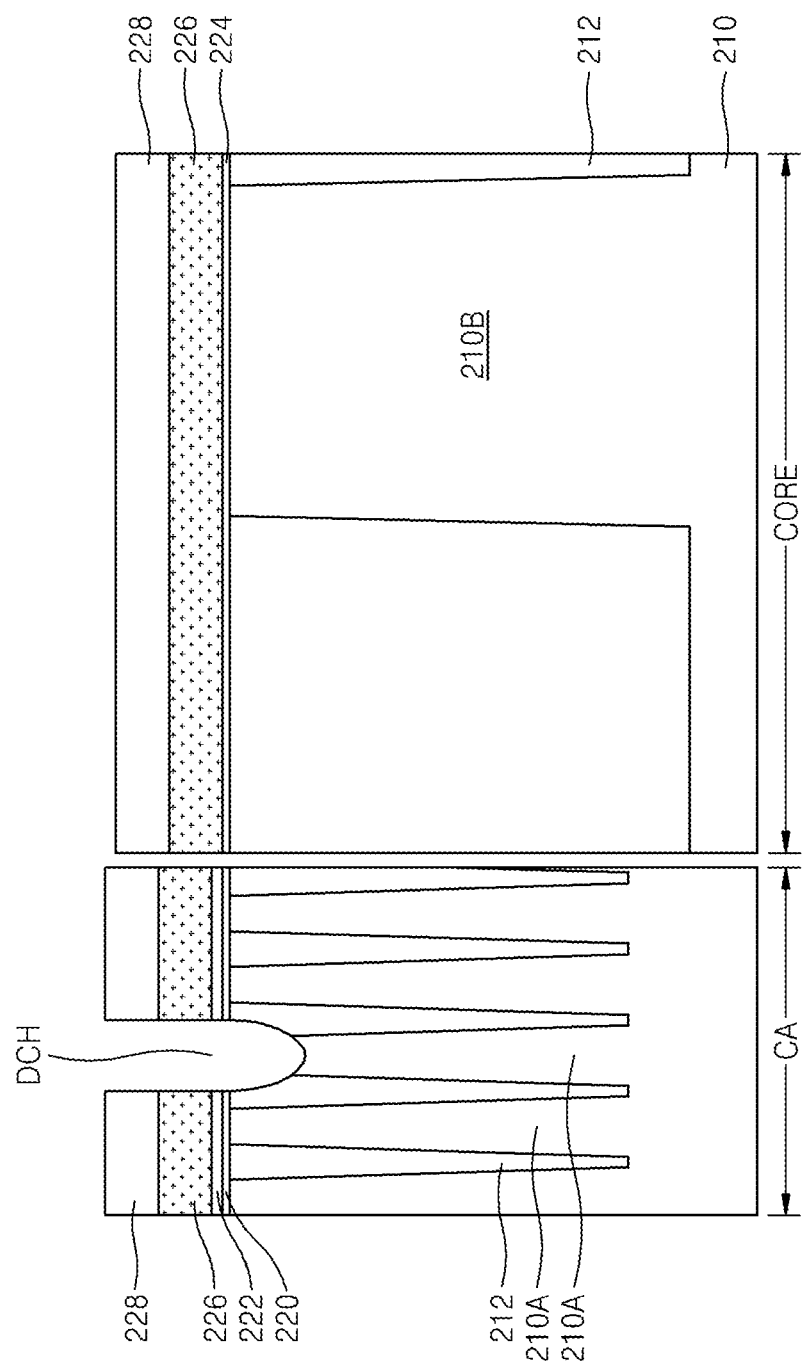
Figure 12D:
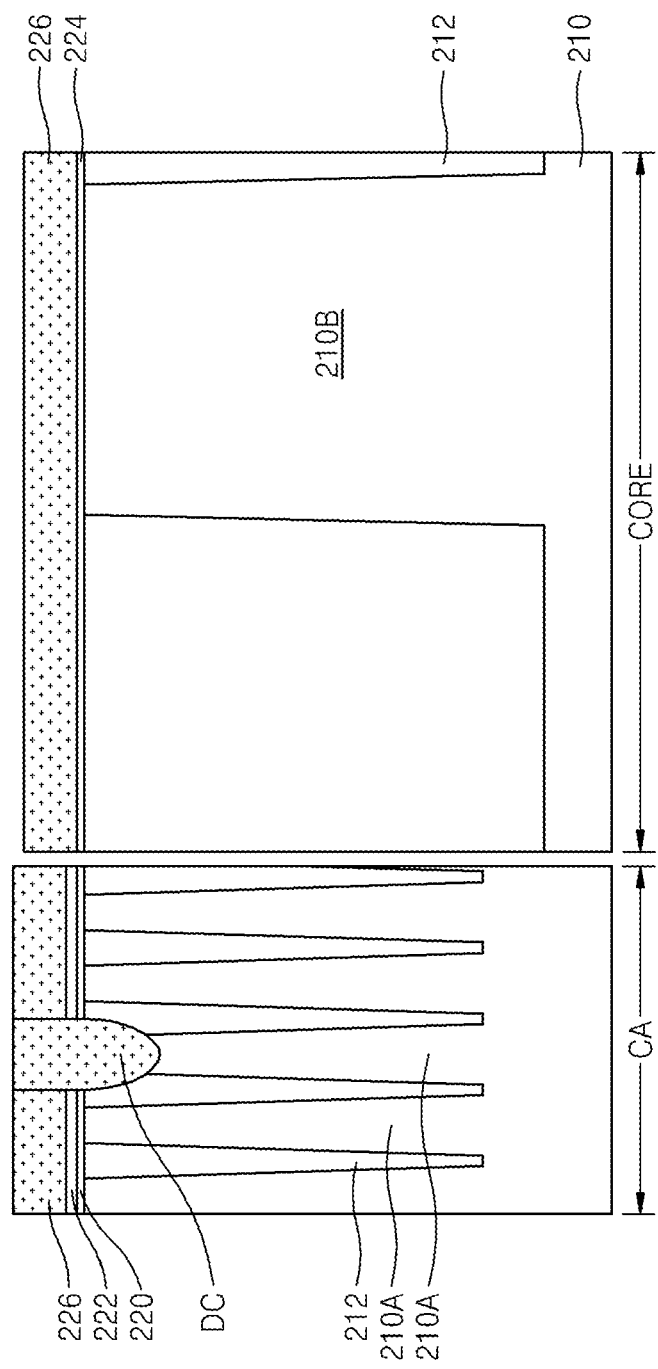
Figure 12E:
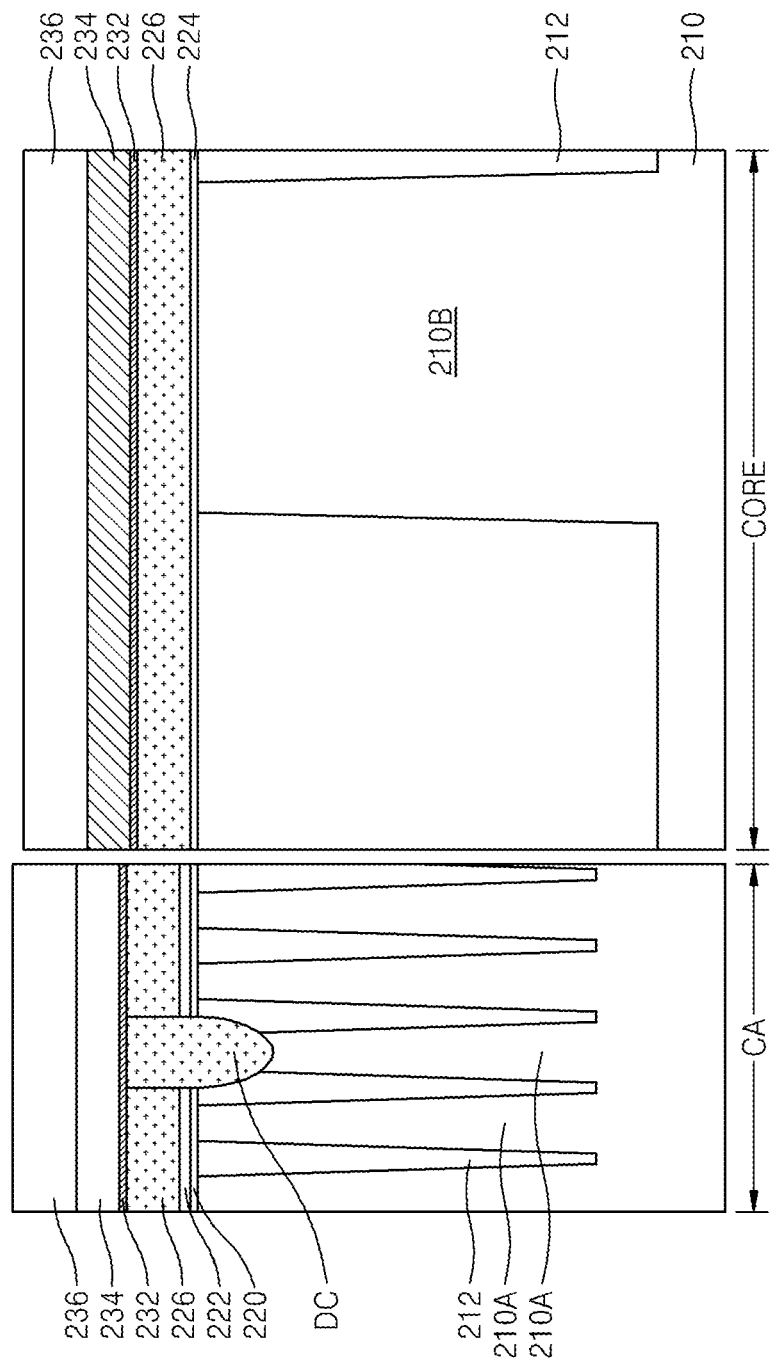
Figure 12F:
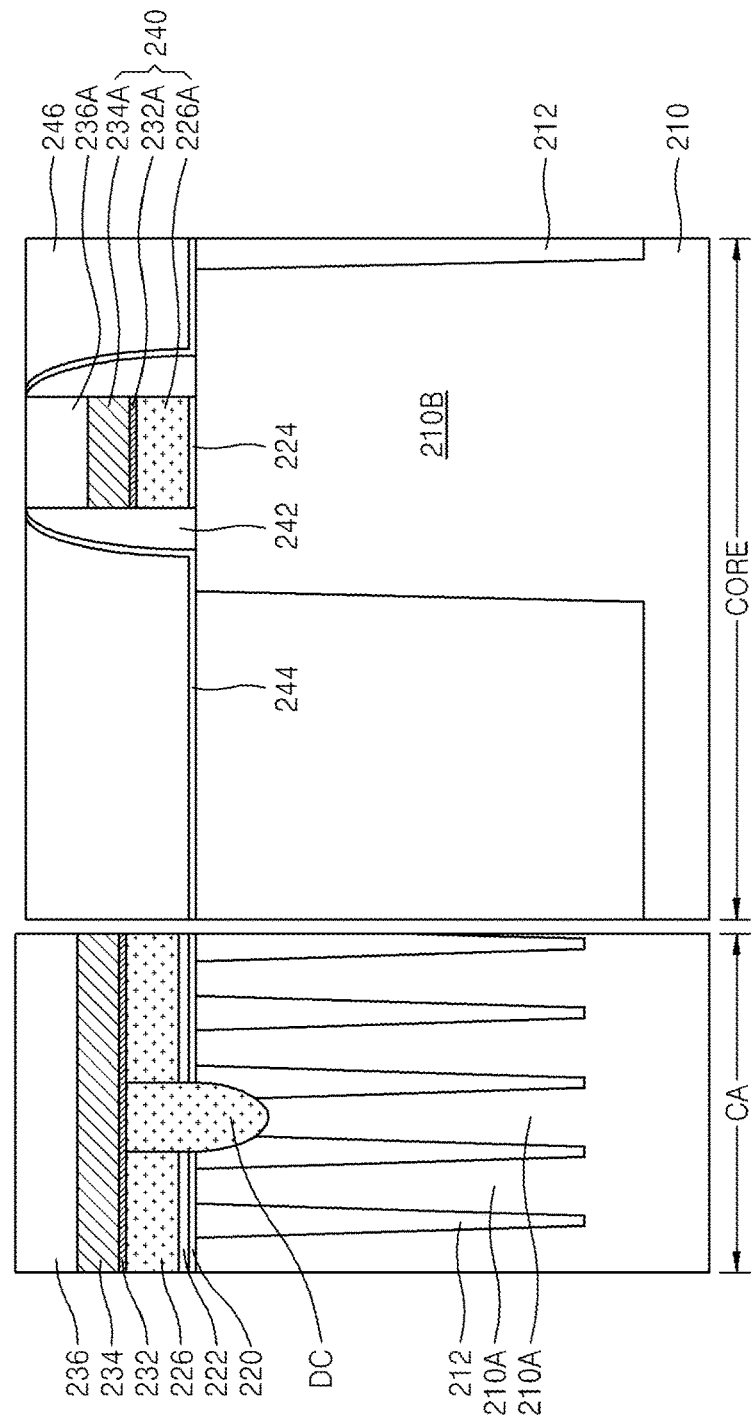
Figure 12G:
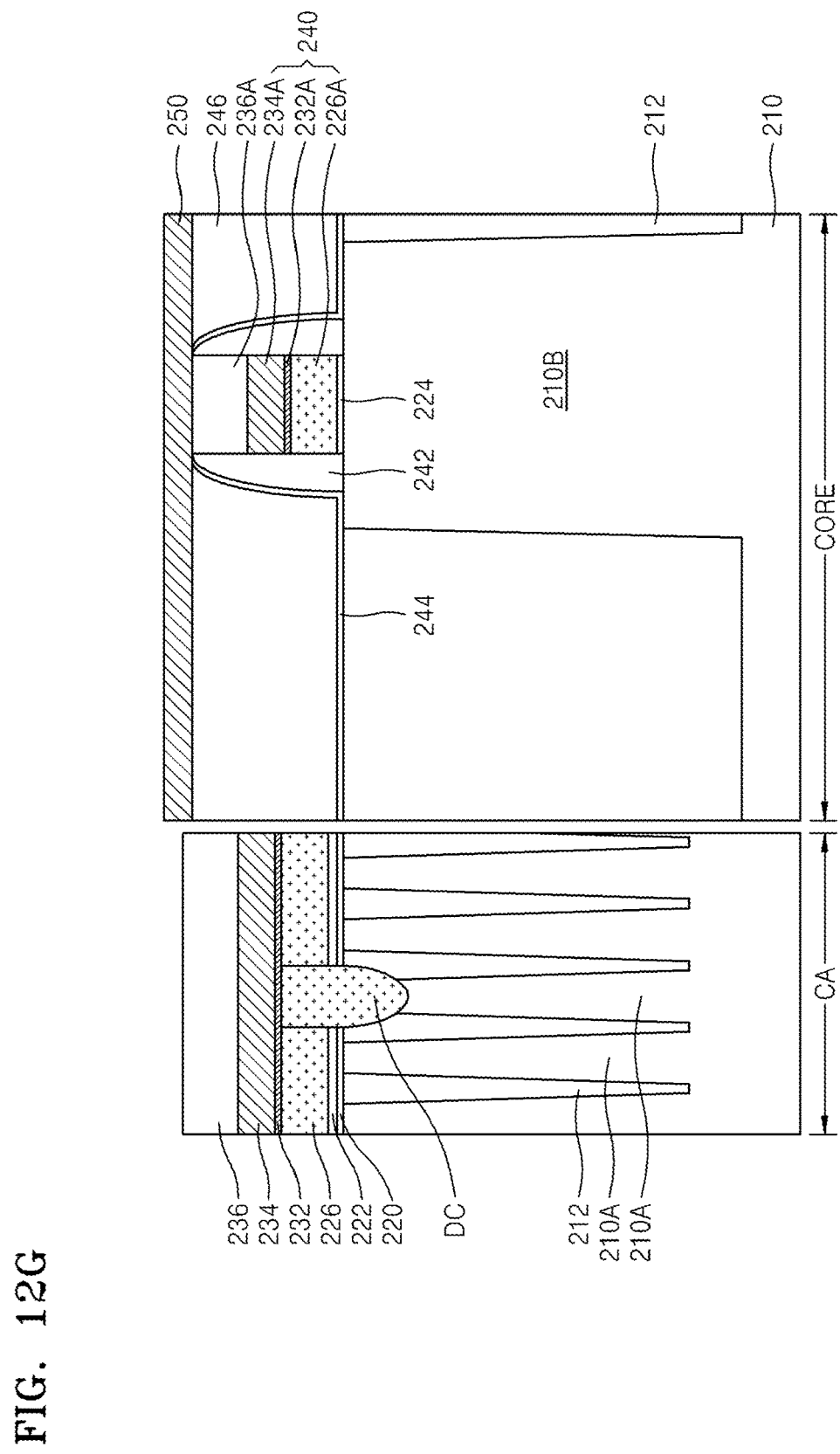
Figure 12H:
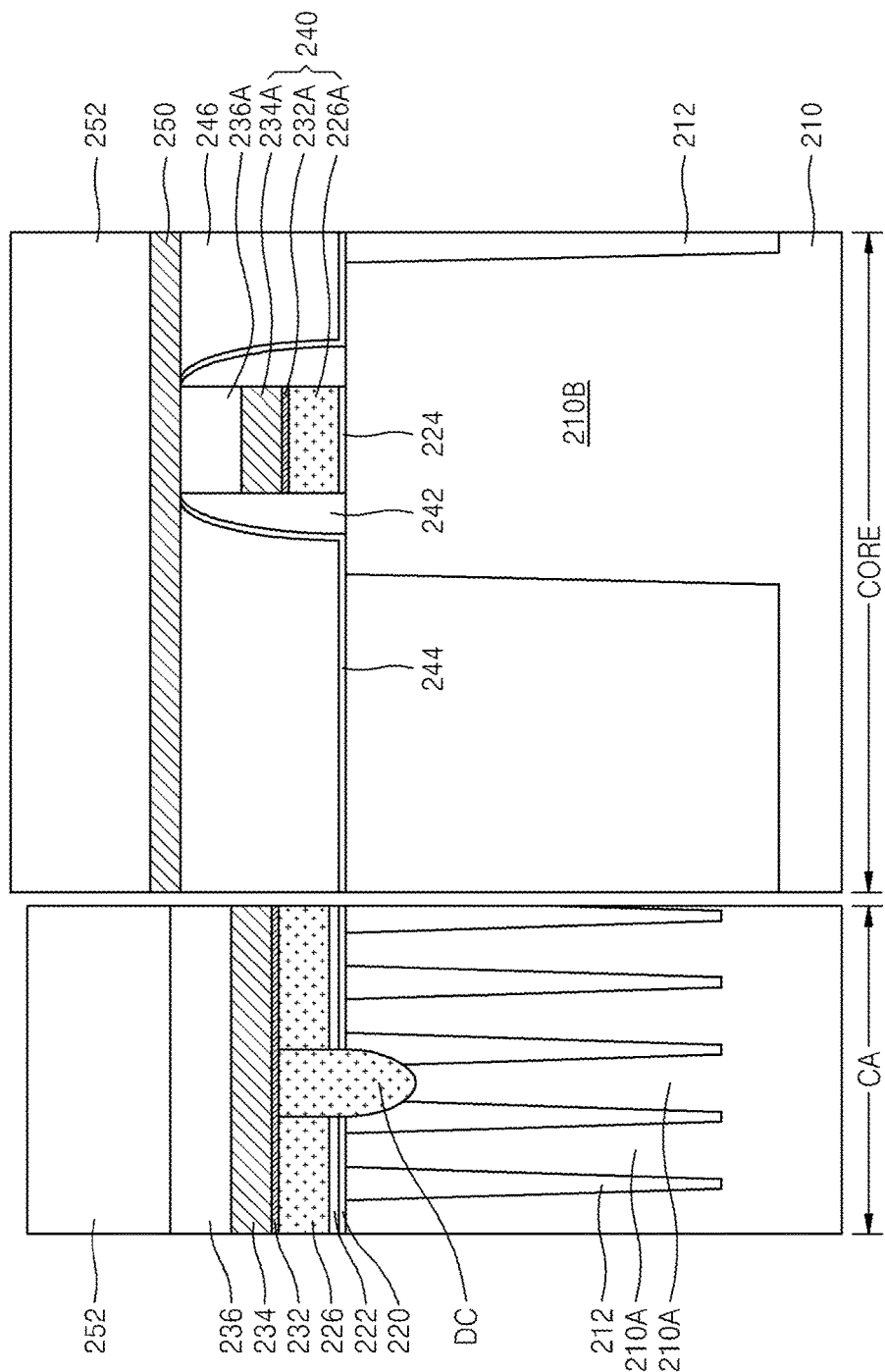
Figure 12I:
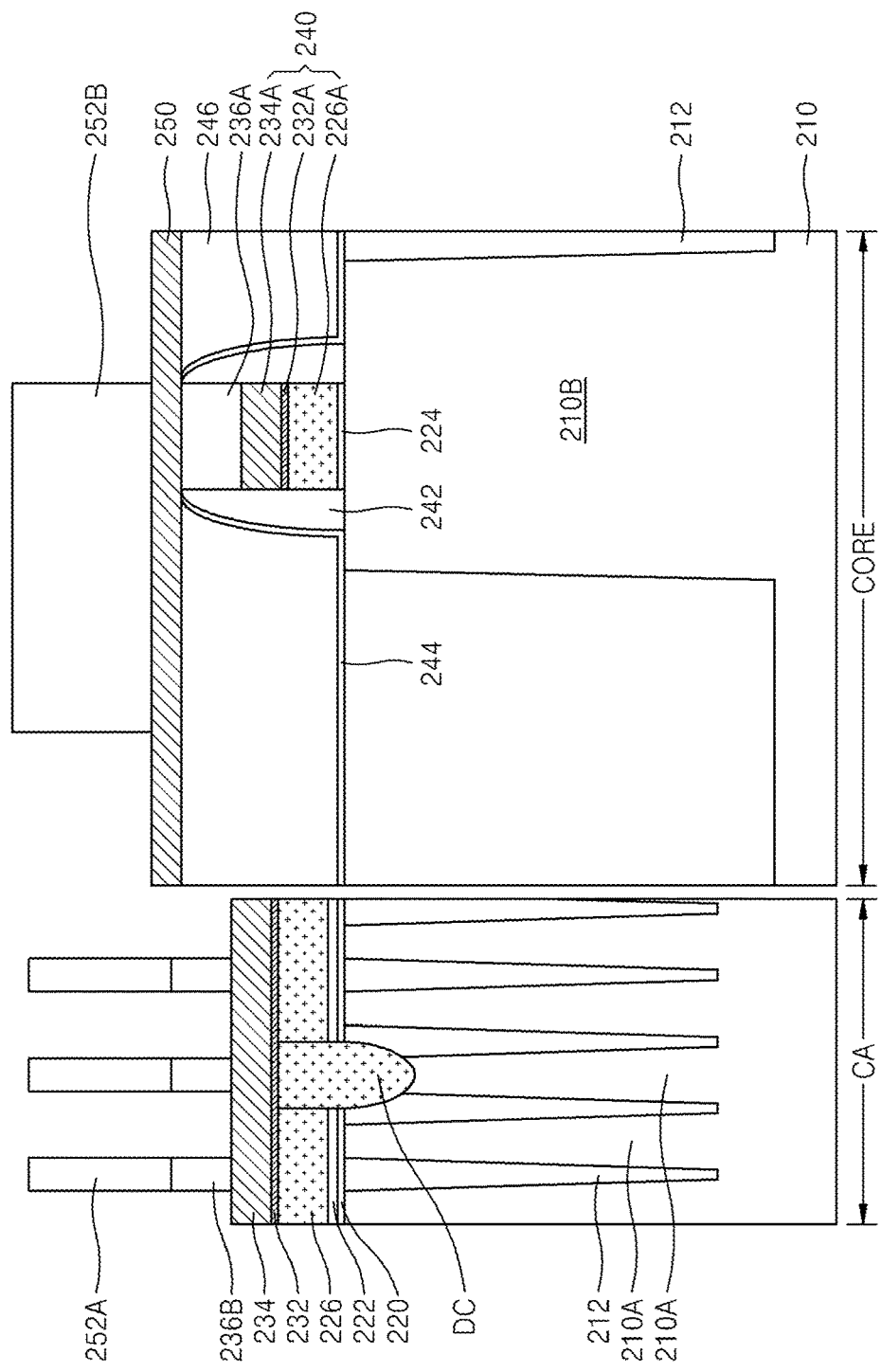
Figure 12J:
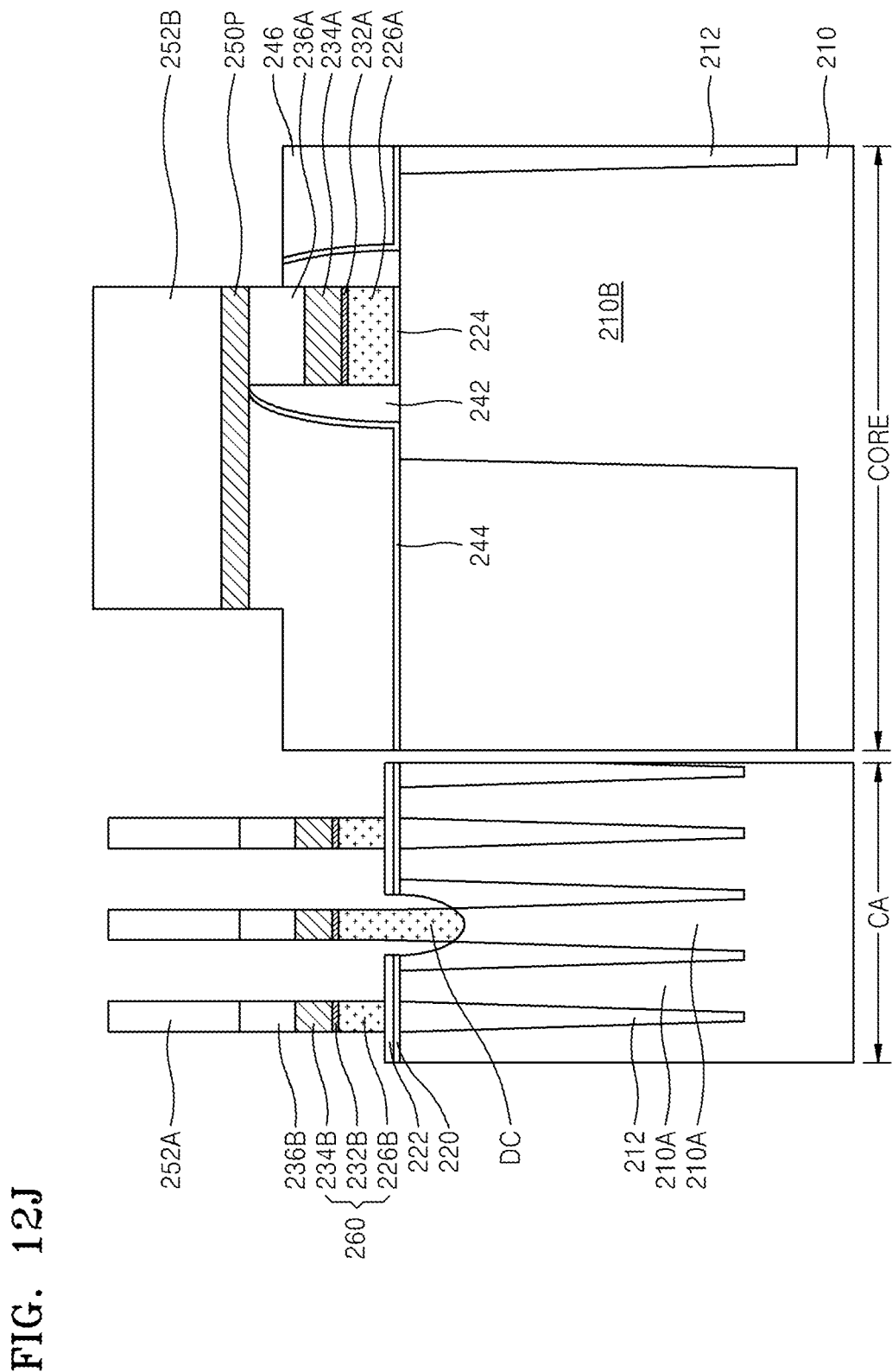
Figure 12K:
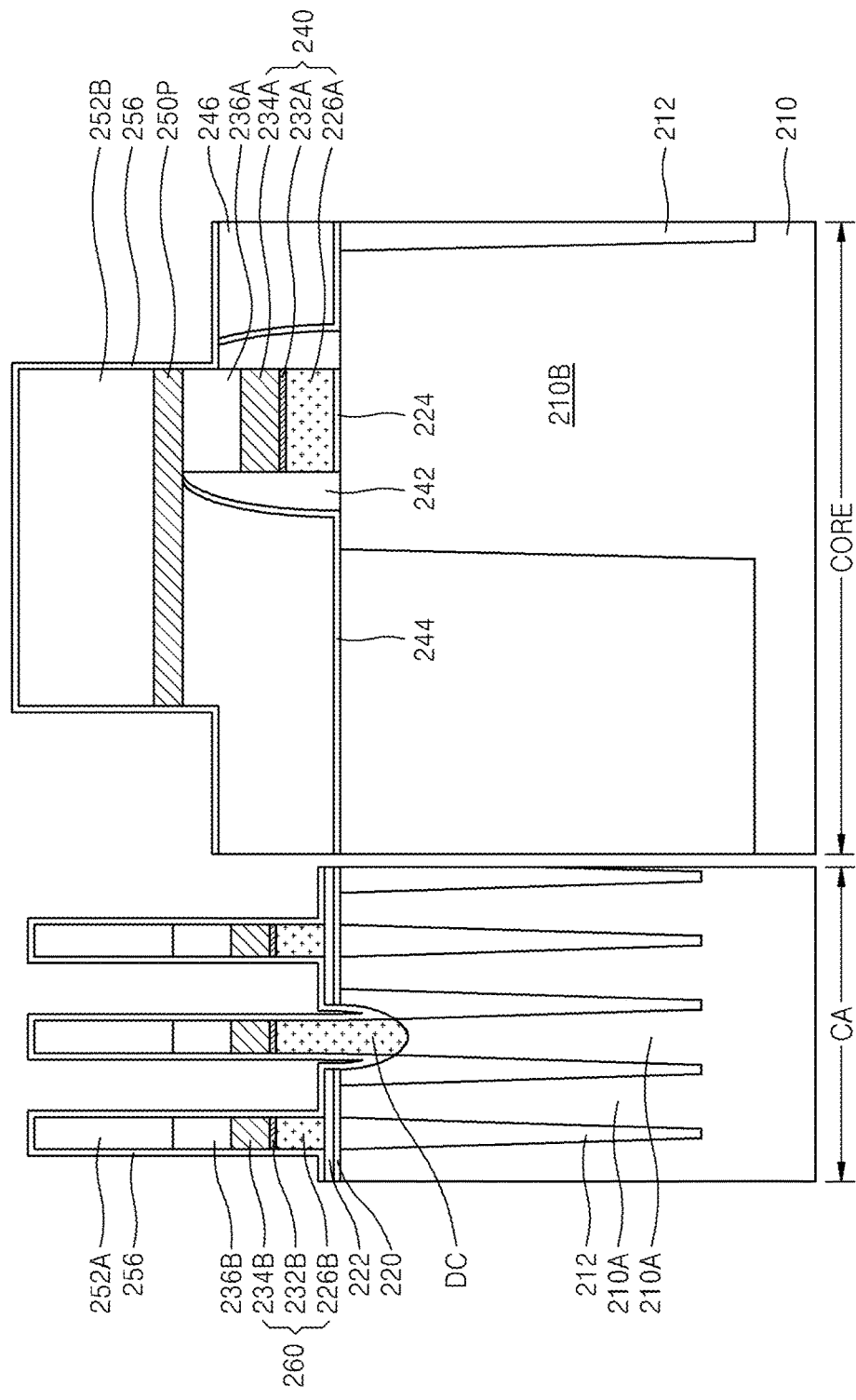
Figure 12L:
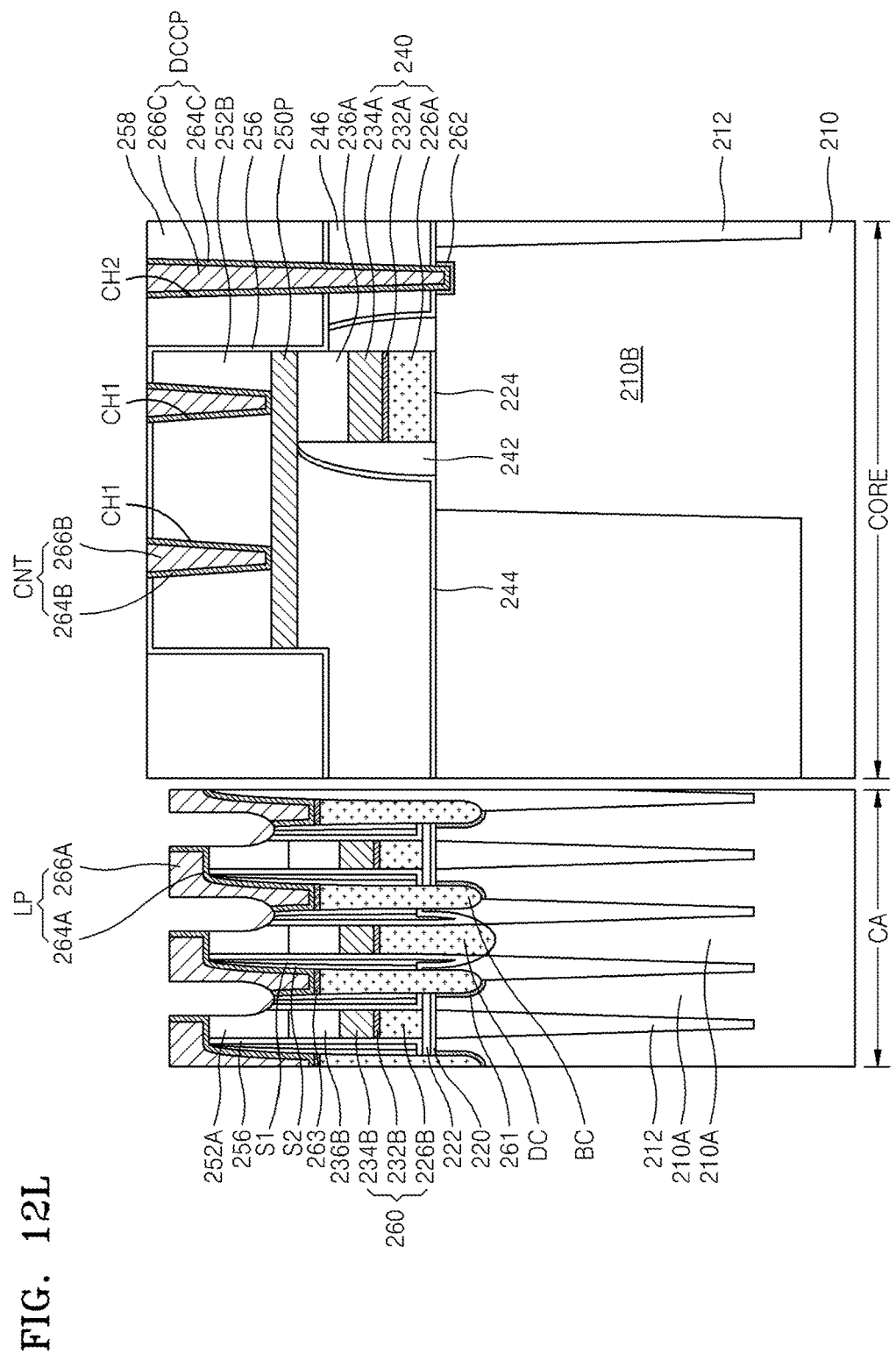
Figure 12M:
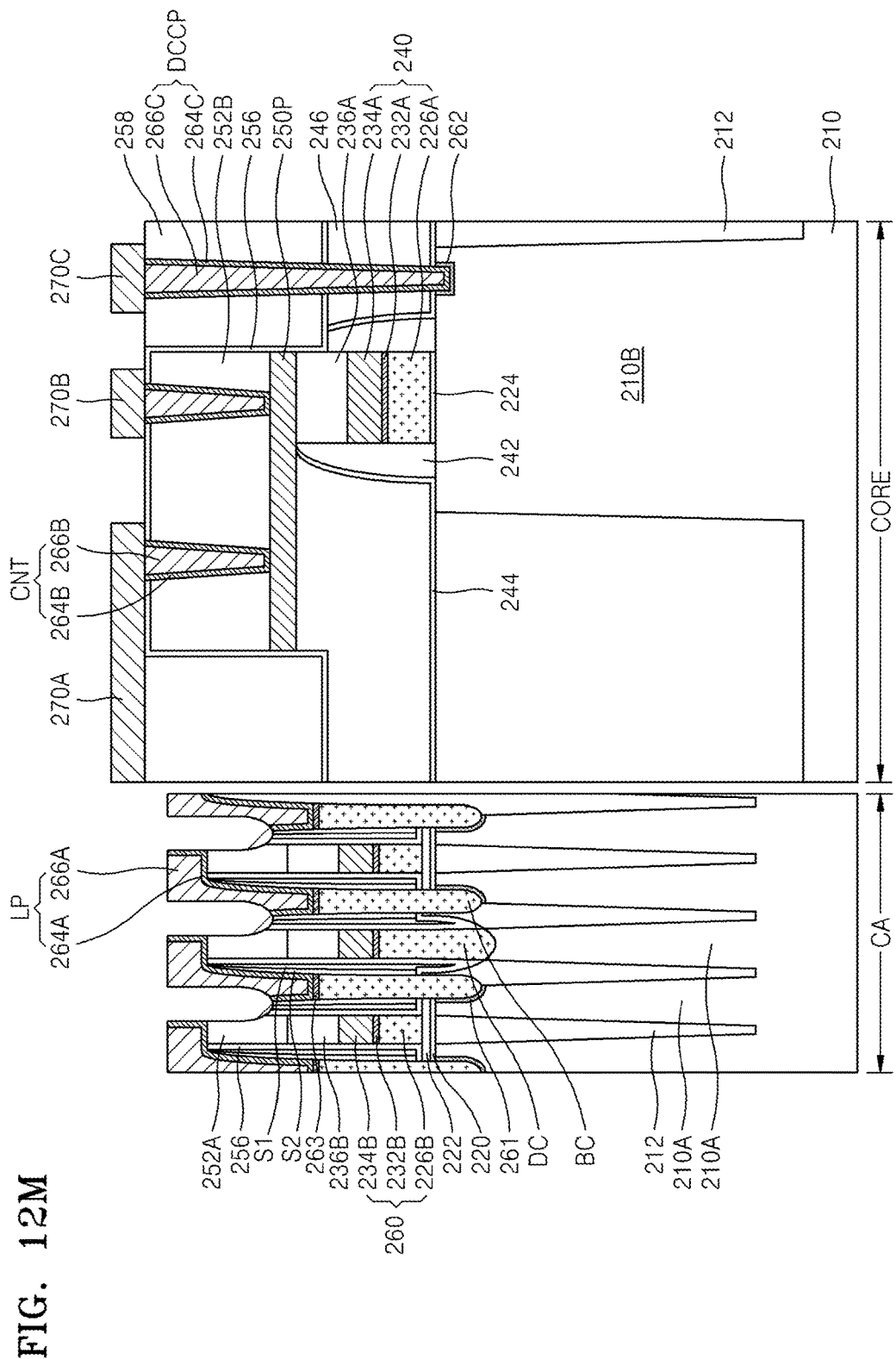
Figure 12N:
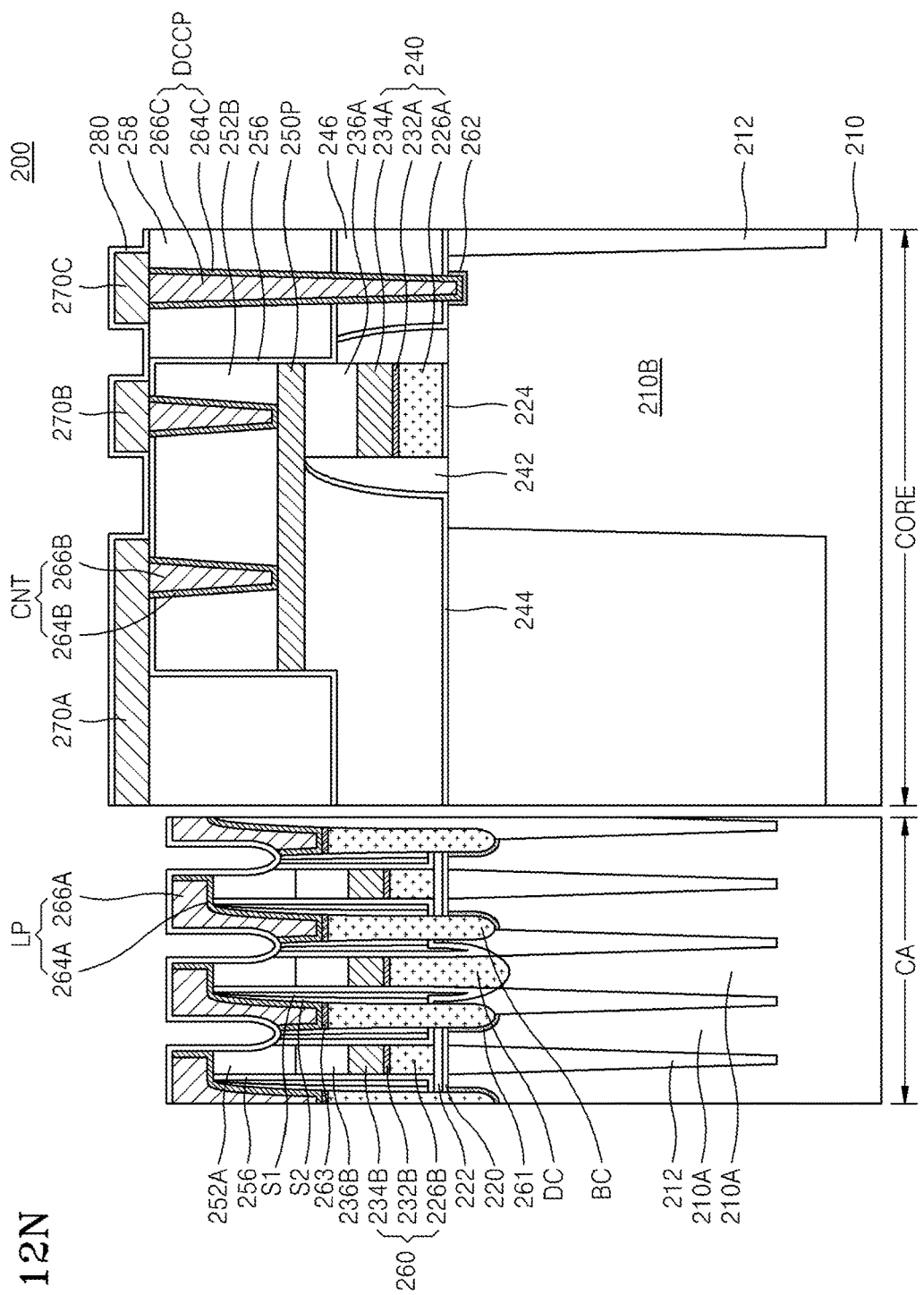

FIGS. 12A through 12N are cross-sectional views illustrated according to a process sequence to explain a method of manufacturing a semiconductor device 200 (refer to FIG. 12N), according to an example embodiment of the inventive concepts.

A process of simultaneously forming an interconnection structure to be formed in a core area CORE and some elements of a memory cell of the memory cell array block MCA illustrated in FIG. 9 is described. However, example embodiments of the inventive concepts are not limited thereto. For example, interconnection structures having various arrangements, which includes the interconnection structure illustrated in FIG. 11B, may be formed based on a method of manufacturing a semiconductor device, which will be described later within the scope of the inventive concepts.

In FIGS. 12A through 12N, a part "CA" is a cross-sectional view illustrating a portion of a cell array area CA of the semiconductor device 200, e.g., a portion corresponding to a cross-section taken along a line A-A' of FIG. 10, and a part "CORE" is a cross-sectional view illustrating a portion of a core area CORE of the semiconductor device 200. In some example embodiments, the cell array area CA of FIGS. 12A through 12N may be a portion of the memory cell array block MCA of FIG. 9. The core area CORE of FIGS. 12A through 12N may be a portion of the sense amplifier block S/A of FIG. 9, a portion of the word line driver block SWD of FIG. 9, or a portion of the row decoder 120 and/or column decoder 140 of FIG. 8. However, example embodiments of the inventive concepts are not limited thereto.

Referring to FIG. 12A, a plurality of active region 210A and 210B are defined in the cell array area CA and the core area CORE, respectively, by forming a device isolation layer 212 in a substrate 210.

Each of the plurality of active regions 210A and 210B may have a relatively long island shape having a minor axis and a major axis as the active region AC illustrated in FIG. 10. Other details of the substrate 210 are the same as those of the substrate 12 described with reference to FIGS. 2A through 2D.

The device isolation layer 212 may include an oxide layer, a nitride layer, or a combination thereof. However, example embodiments of the inventive concepts are not limited thereto. The isolation layer 212 may include a single layer including one insulating layer or a multi-layered structure including a combination of at least three kinds of insulating layers.

A plurality of word line trenches are formed in the substrate 210 in the cell array area CA. The plurality of word line trenches may extend parallel to one another in the X direction of FIG. 10, and may have line shapes intersecting the plurality of active regions 210A, respectively. A plurality of gate dielectric layers, a plurality of word lines WL (refer to FIG. 10), and a plurality of buried insulating layers are sequentially formed within the plurality of word line trenches. The upper surfaces of the plurality of buried insulating layers may be disposed at about the same level as the upper surface of the substrate 210.

In some example embodiments, after the word lines WL 22 are formed, impurity ions may be implanted into the substrate 210 on both sides of the word lines WL 22 so that source and drain regions (not shown) can be formed in top surfaces of the plurality of active regions 210A. In other example embodiments, before the plurality of word lines WL 22 are formed, an ion implantation process for forming source and drain regions may be performed.

A first insulating layer 220 and a second insulating layer 222 are sequentially formed on the substrate 210 in the cell array area CA and core area CORE. Thereafter, the first and second insulating layers 220 and 222 are removed in the core area CORE to expose the active region 210B of the substrate 210 again. Thereafter, a gate dielectric layer 224 is formed on the substrate 210 in the core area CORE in a state in which a mask pattern (not shown) covers the cell array area CA.

The first insulating layer 220 may include an oxide layer, and the second insulating layer 222 may include a nitride layer. However, example embodiments of the inventive concepts are not limited thereto.

The gate dielectric layer 224 may include at least one selected from the group of a silicon oxide layer, a silicon nitride layer, a silicon oxynitride layer, an oxide/nitride/oxide (ONO) layer, and a high-k dielectric layer having a higher dielectric constant than a silicon oxide layer. For example, the gate dielectric layer 224 may have a dielectric constant of about 10 to about 25. In some example embodiments, the gate dielectric layer 224 may include at least one selected from the group consisting of hafnium oxide (HfO), hafnium silicate (HfSiO), hafnium oxynitride (HfON), hafnium silicon oxynitride (HfSiON), lanthanum oxide (LaO), lanthanum aluminium oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminium oxide (AlO), and lead scandium tantalum oxide (PbScTaO). For example, the gate dielectric layer 120 may include $HfO_2$, $Al_2O_3$, $HfAlO_3$, $Ta_2O_3$, or $TiO_2$.

Referring to FIG. 12B, a first conductive layer 226 is formed on the substrate 210 in the cell array area CA and the core area CORE.

The first conductive layer 226 may be formed of doped poly silicon. However, example embodiments of the inventive concepts are not limited thereto.

Referring to FIG. 12C, a mask pattern 228 is formed on the first conductive layer 226 in the cell array area CA and the core area CORE. The mask pattern 228 includes an opening exposing a portion of the first conductive layer 226 in the cell array area CA. The core area CORE is covered by the mask pattern 228 and thus may not be exposed to the outside.

Next, a direct contact hole DCH exposing the active region 210A of the substrate 210 is formed in the cell array area CA by etching the first conductive layer 226, which is exposed through the opening of the mask pattern 228, and then etching a portion of the substrate 210 and a portion of the device isolation layer 212, which are exposed as a result of the etching of the first conductive layer 226.

The mask pattern 228 may be a hard mask pattern including an oxide layer or a nitride layer. A photolithography process may be used to form the mask pattern 228.

Referring to FIG. 12D, after removing the mask pattern 228, a second conductive layer (not shown) having a thickness sufficient for filling the direct contact hole DCH is formed in the direct contact hole DCH and on the first conductive layer 226. Next, a direct contact DC including a portion of the second conductive layer is formed by performing an etch back process on the second conductive layer so that the second conductive layer remains only within the direct contact hole DCH. The second conductive layer may be formed of doped polysilicon. However, example embodiments of the inventive concepts are not limited thereto.

Referring to FIG. 12E, in the cell array area CA and the core area CORE, a third conductive layer 232, a fourth conductive layer 234, and a capping layer 236 are sequentially formed on the first conductive layer 226 and the direct contact DC.

The third conductive layer 232 and the fourth conductive layer 234 each may be formed of TiN, TiSiN, W, tungsten silicide, or a combination thereof. However, example embodiments of the inventive concepts are not limited thereto. In some embodiments, the third conductive layer 232 may formed of TiSiN, and the fourth conductive layer 234 may be formed of W. The capping layer 236 may include a silicon nitride layer.

Referring to FIG. 12F, the gate dielectric layer 224, the first conductive layer 226, the third conductive layer 232, the fourth conductive layer 234, and the capping layer 236 are patterned in the core area CORE in a state in which the cell array area CA is covered with a mask pattern (not shown). As a result, a gate electrode 240 for a peripheral circuit, which includes a first conductive pattern 226A, a third conductive pattern 232A, and a fourth conductive pattern 234A, is formed on the gate dielectric layer 224. The gate electrode 240 is covered with a capping pattern 236A.

After forming an insulating spacer 242 at both side walls of a gate structure having a stack structure including the gate dielectric layer 224, the gate electrode 240, and the capping pattern 236A, an insulating thin film 244 is formed on the whole surface of the core area CORE to cover the gate structure.

The insulating spacer 242 may be formed of oxide, nitride, or a combination thereof, and the insulating thin film may be formed of nitride. However, example embodiments of the inventive concepts are not limited thereto.

Next, a planarized interlayer insulating layer 246, which covers the gate structure and the insulating thin film 244, is formed. The interlayer insulating layer 246 may include a silicon oxide layer formed by using high density plasma (HDP) or flowable chemical vapor deposition (FCVD). However, example embodiments of the inventive concepts are not limited thereto.

Referring to FIG. 12G, a bypass conductive layer 250 covering the interlayer insulating layer 246 is formed in the core area CORE.

After forming a conductive layer extending over the cell array area CA and the core area CORE, the bypass conductive layer 250 may remain only in the core area CORE by removing a portion of the conductive layer by using photolithography.

The bypass conductive layer 250 may be formed of Tungsten W. However, example embodiments of the inventive concepts are not limited thereto.

Referring to FIG. 12H, an insulating layer 252 is formed on the capping layer 236 and the bypass conductive layer 250 in the cell array area CA and the core area CORE.

In some example embodiments, the insulating layer 252 may include a nitride layer. However, example embodiments of the inventive concepts are not limited thereto.

Referring to FIG. 12I, the insulating layer 252 and the capping layer 236 are patterned by using photolithography. As a result, a cell mask pattern 252A and a capping pattern 236B, which is used as an etch mask for the formation of a plurality bit lines, are formed in the cell array area CA. At the same time, a core mask pattern 252B for the formation of a bypass interconnection line is formed in the core area CORE due to the patterning of the insulating layer 252.

Referring to FIG. 12J, a portion of a structure under the capping pattern 236B and the core mask pattern 252B is etched by using the cell mask pattern 252A, the capping pattern 236B, and the core mask pattern 252B as an etch mask, and thus, a plurality of bit lines 260 are formed in the cell array area CA and a bypass interconnection line 250P is formed in the core area CORE.

In some example embodiments, the plurality of bit lines 260 and the bypass interconnection line 250P are formed at the same time.

More specifically, in the cell array area CA, an exposed portion of the first conductive layer 226 and portions of the third and fourth conductive layers 232 and 234 under the exposed portion of the first conductive layer 226 are etched by using the cell mask pattern 252A and the capping pattern 236A as an etch mask. Thus, the plurality of bit lines 260, each of which includes a first conductive pattern 226B, a third conductive pattern 232B, and a fourth conductive pattern 234B, are formed in the cell array area CA. The plurality of bit lines 260 are connected to the active region 210A of the substrate 210 via the direct contact DC. In the core area CORE, an exposed portion of the bypass conductive layer 250 is etched by using the core mask pattern 252B as an etch mask and thus the bypass interconnection line 250P is formed. The bypass interconnection line 250P is spaced apart from the active region 210B and is not connected to the active region 210B. While etching the exposed portion of the bypass conductive layer 250 to form the bypass interconnection line 250P, insulating layers under the bypass conductive layer 250 may be partially removed due to over-etching.

Referring to FIG. 12K, an insulating liner 256 is formed on the upper surface of a resultant structure of FIG. 12J in which the plurality of bit lines 260 and the bypass interconnection line 250P were formed. The insulating liner 256 may be formed of nitride. However, example embodiments of the inventive concepts are not limited thereto.

Referring to FIG. 12L, a planarized interlayer insulating layer 258 is formed in the core area CORE. Then, in the cell array area CA, a plurality of buried contacts BC (refer to FIG. 10) and a plurality of conductive landing pads LP that are connected to the plurality of buried contacts BC are formed in spaces between each of the plurality of bit lines 260.

In more detail, after forming insulating spacers S1 and S2, which cover the insulating liner 256 at side walls of each of the plurality of bit lines 260, in the cell array area CA of the resultant structure of FIG. 12K and forming a plurality of insulating patterns (not shown in FIG. 12L), which define a plurality of holes for forming a plurality of buried contacts BC (refer to FIG. 10) in spaces between each of the plurality of bit lines 260, the active region 210A of the substrate 210 is exposed through the plurality of holes and a metal silicide layer 261 is formed on the surface of the exposed active region 210A. Then, the plurality of buried contacts BC that are connected to the active region 210A are formed by filling a lower portion of the inside of each hole with a conductive layer.

In some example embodiments, the metal silicide layer 261 may be formed of cobalt silicide. However, example embodiments of the inventive concepts are not limited thereto, and the metal silicide layer 261 may be formed of a material selected from various kinds of metal silicides. In some embodiments, the plurality of buried contacts BC may be formed of doped polysilicon. In some embodiments, the metal silicide layer 261 may be omitted.

In some example embodiments, the insulating spacers S1 and S2 may be formed of silicon oxide, silicon nitride, air, or a combination thereof. Although FIG. 12L illustrates that the insulating spaces S1 and S2 include a double layer, example embodiments of the inventive concepts are not limited thereto. For example, each of the insulating spaces S1 and S2 may include a single layer or a triple layer. The plurality of insulating patterns may include a nitride layer, an oxide layer, or a combination thereof.

Next, a metal silicide layer 263 is formed on the plurality of buried contacts BC in the plurality of holes between the plurality of bit lines 260. In some example embodiments, the metal silicide layer 263 may be formed of cobalt silicide. However, example embodiments of the inventive concepts are not limited thereto, and the metal silicide layer 263 may be formed of a material selected from various kinds of metal silicides. In some example embodiments, the metal silicide layer 263 may be omitted.

A plurality contact holes CH1 exposing the bypass interconnection line 250P are formed in the core area CORE by etching a portion of the core mask pattern 252B. In addition, a direct contact hole CH2 exposing the active region 210B of the substrate 102 is formed in the core area CORE by etching a portion of the interlayer insulating layer 246 and 258 and a portion of the insulating thin film 244. The plurality of contact holes CH1 and the direct contact hole CH2 may be simultaneously formed through one etching process.

A metal silicide layer 262 is formed on a surface of the active region 210B that is exposed through the direct contact hole CH2. In some example embodiments, the metal silicide layer 262 may be formed of cobalt silicide. However, example embodiments of the inventive concepts are not limited thereto, and the metal silicide layer 262 may be formed of a material selected from various kinds of metal silicides. In some example embodiments, the metal silicide layer 262 may be omitted.

Next, in the cell array area CA and the core area CORE, a conductive barrier layer and a conductive layer are formed and are etched back so that the interlayer insulating layer 258 is exposed.

As a result, in the cell array area CA, a portion of the conductive barrier layer and a portion of the conductive layer remain as a first conductive barrier layer 264A and a first conductive layer 266A, respectively, which cover each of the plurality of bit lines 260 so as to vertically overlap with a portion of each of the plurality of bit lines 260 while filling the inside of each of the plurality of hoes on the metal silicide layer 263.

A portion of the conductive barrier layer and a portion of the conductive layer remain in the core area CORE a as a second conductive barrier layer 264B and a second conductive layer 266B, which fill the inside of each of the plurality of contact holes CH1, and a third conductive barrier layer 264C and a third conductive layer 266C, which fill the direct contact hole CH2.

In some example embodiments, the first conductive barrier layer 264A, the second conductive barrier layer 264B, and the third conductive barrier layer 264C each may have a Ti/TiN stack structure. In some example embodiments, the first conductive layer 266A, the second conductive layer 266B, and the third conductive layer 266C each may be formed of doped polysilicon, metal, metal silicide, conductive metal nitride, or a combination thereof.

Next, after a mask pattern (not shown) exposing a portion of the first conductive layer 266A is formed on the first conductive layer 266A, the first conductive barrier layer 264A, the first conductive layer 266A, and insulating layers around them are etched in the cell array area CA by using the mask pattern as an etching mask and thus a plurality of landing pads LP, which includes a remaining portion of the first conductive barrier layer 264A and a remaining portion of the first conductive layer 266A, are formed.

The second conductive barrier layer 264B and the second conductive layer 266B, which are placed in the plurality of contact holes CH1, form a plurality of contact plugs CNT that are connected to the bypass interconnection line 250P in the core area CORE. The third conductive barrier layer 264C and the third conductive layer 266C, which are placed in the direct contact hole CH2, form a direct contact plug DCCP that is connected to the active region 210B.

The plurality of contact plugs CNT connected to the bypass interconnection line 250P penetrate the core mask pattern 252B, and the direct contact plug DCCP penetrates the interlayer insulating layer 246 and 258 at a position separated from the core mask pattern 252B.

The plurality of landing pads LP have shapes of a plurality of island-like patterns spaced apart from one another, similar to the plurality of buried contacts BC illustrated in FIG. 10. The mask pattern may include a silicon nitride layer. However, example embodiments of the inventive concepts are not limited thereto.

Referring to FIG. 12M, a plurality of interconnection layers 270A, 270B, and 270C are formed in the core area CORE on the core mask pattern 252B and the interlayer insulating layer 258.

The plurality of interconnection layers 270A, 270B, and 270C include a first interconnection line 270A, which is connected to one of the plurality of contact plugs CNT, a second interconnection line 270B, which is connected to another of the plurality of contact plugs CNT, and a third interconnection layer 270C that is connected to the direct contact plug DCCP.

In some example embodiments, each of the plurality of interconnection layers 270A, 270B, and 270C may include a single metal layer or a plurality of metal layers. In other example embodiments, the plurality of interconnection layers 270A, 270B, and 270C may include a semiconductor doped with impurities, metal nitride, or metal silicide. For example, the plurality of interconnection layers 270A, 270B, and 270C may be formed of tungsten W.

Referring to FIG. 12N, an insulating thin film 280 is formed on an upper surface of a resultant structure that includes the plurality of conductive landing pads LP formed in the cell array area CA and the plurality of interconnection layers 270A, 270B, and 270C formed in the core area CORE. The insulating thin film 280 may be formed of nitride. However, example embodiments of the inventive concepts are not limited thereto.

Next, the semiconductor device 200 may be formed by forming an insulating layer on the insulating thin film 280 in the cell array area CA and the core area CORE, forming a plurality of capacitor lower electrodes (corresponding to the lower electrode ST of FIG. 10) capable of being electrically connected to the plurality of conductive landing pads LP in the cell array area CA, and forming a multi-layered interconnection structure in the core area CORE.

Figure 13:
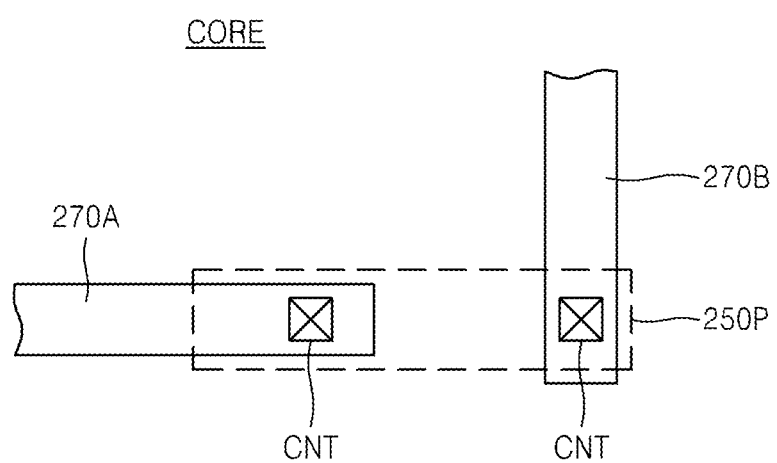
FIG. 13 is a plan view illustrating the disposition of a bypass interconnection line and the disposition of first and second interconnection layers which are connected to the bypass interconnection line via a plurality of contact plugs.

FIG. 13 is a plan view illustrating the disposition of the bypass interconnection line 250P and the disposition of first and second interconnection layers 270A and 270B which are connected to the bypass interconnection line 250P via the plurality of contact plugs CNT.

The first interconnection layer 270A and the second interconnection layer 270B are spaced apart from each other, and at least portions of them may extend in different directions. As illustrated in FIG. 12N, the first interconnection layer 270A and the second interconnection layer 270B may extend parallel in the core area CORE, in a direction in which the main surface of the substrate 210 extends and at a level that is higher than a level of upper surfaces of the plurality of conductive landing pads LP formed in the cell array area CA.

The bypass interconnection line 250P extends on a plane at a lower level than a plane on which the first interconnection layer 270A and the second interconnection layer 270B are formed. As illustrated in FIG. 12N, the bypass interconnection line 250P may extend parallel in the core area CORE in a direction in which the main surface of the substrate 210 extends and at a lower level than a level of the upper surfaces of the plurality of conductive landing pads LP formed in the cell array area CA.

FIGS. 14A through 14G are cross-sectional views illustrated according to a process sequence to explain a method of manufacturing a semiconductor device 300 (refer to FIG. 14G), according to another example embodiment of the inventive concepts. In FIGS. 12A through 12N and FIGS. 14A through 14G, the same elements are denoted by the same reference numerals, and thus, repeated descriptions are omitted.

Similar to the semiconductor device 200 illustrated in FIG. 12N, the semiconductor device 300 has an interconnection structure in which a first interconnection layer 270A and a second interconnection layer 270B, which are disposed apart from each other, are connected to each other via a bypass interconnection line 350 (refer to FIG. 14G) formed at a level different from those of the first and second interconnection layers 270A and 270B. A method of manufacturing the semiconductor device 300 by using a process different from that of FIGS. 12A through 12N is described.

Figure 14A:
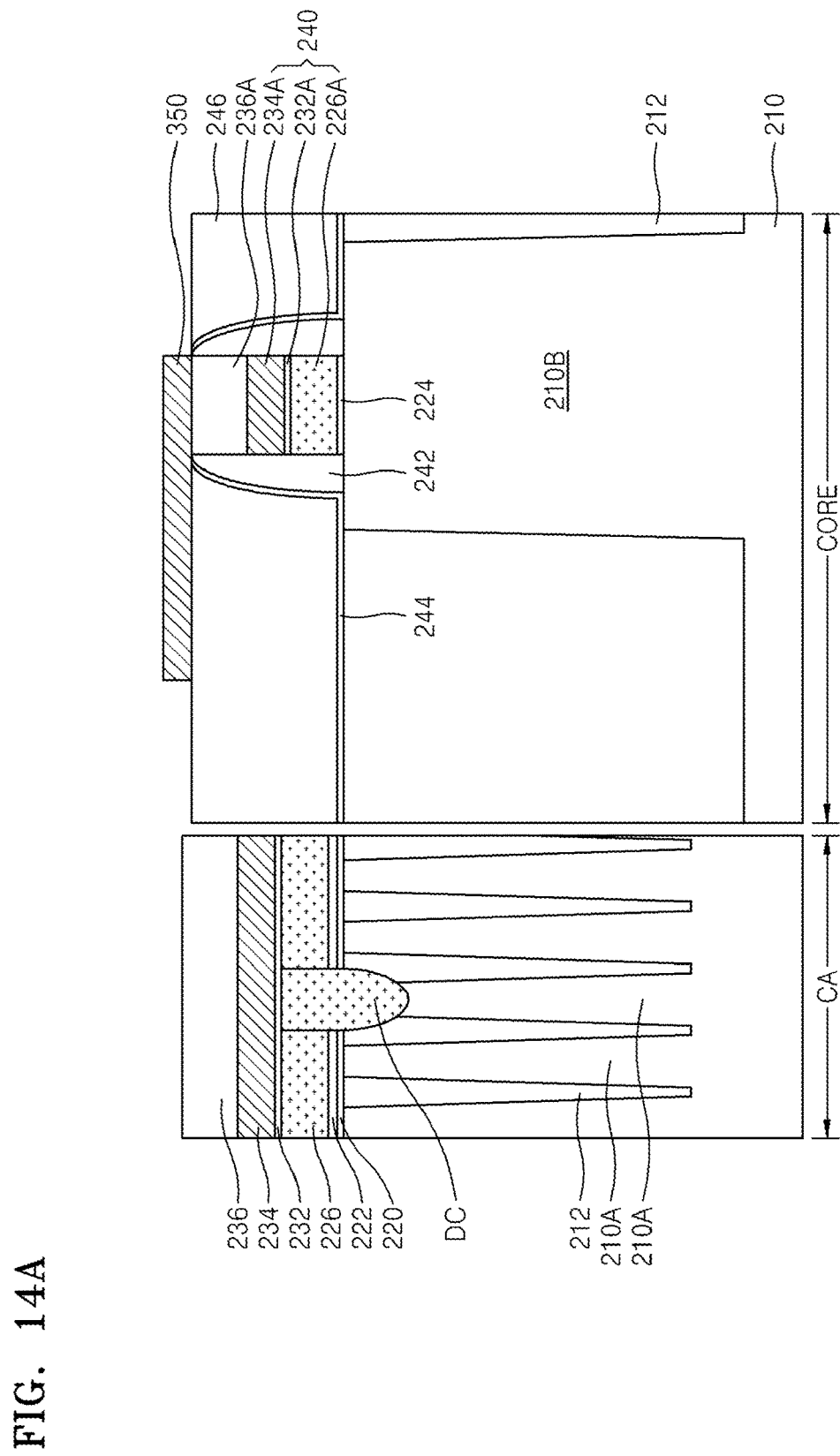
FIGS. 14A through 14G are cross-sectional views according to a process sequence to explain a method of manufacturing a semiconductor device, according to another example embodiment of the inventive concepts.

Referring to FIG. 14A, after performing the series of processes as described with reference to FIGS. 12A through 12F, the bypass interconnection line 350 covering an interlayer insulating layer 246 is formed in a core area CORE.

After forming a bypass conductive layer extending over a cell array area CA and the core area CORE, the bypass interconnection line 350 may remain only in the core area CORE by removing a portion of the bypass conductive layer in the cell array area CA and the core area CORE by using photolithography.

The bypass interconnection line 350 may be formed of W or A. However, example embodiments of the inventive concepts are not limited thereto.

Figure 14B:
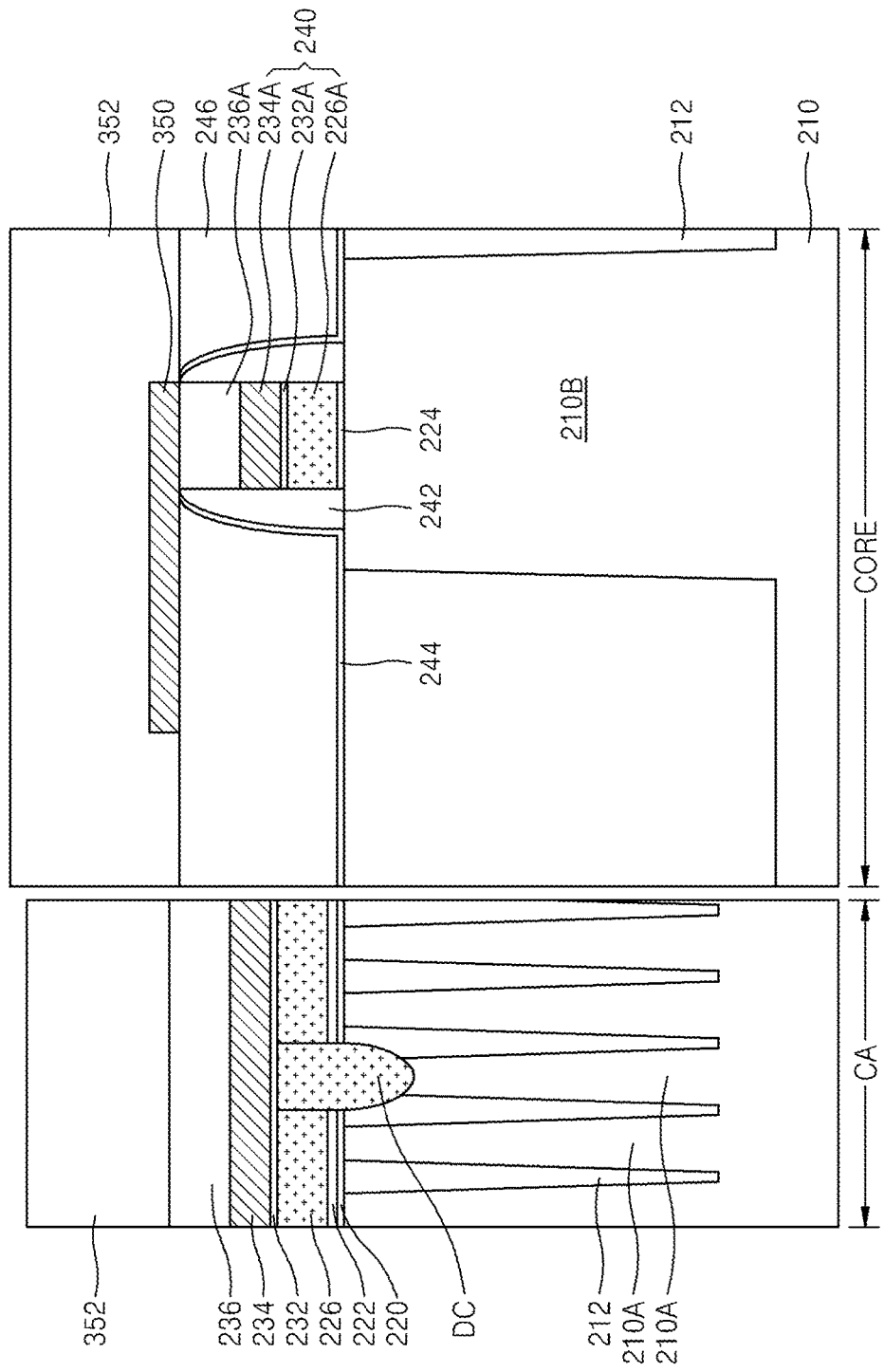

Referring to FIG. 14B, in the cell array area CA and the core area CORE, an insulating layer 352 is formed on a capping layer 236 and the bypass interconnection line 350.

In some example embodiments, the insulating layer 352 may include a nitride layer. However, example embodiments of the inventive concepts are not limited thereto.

Figure 14C:
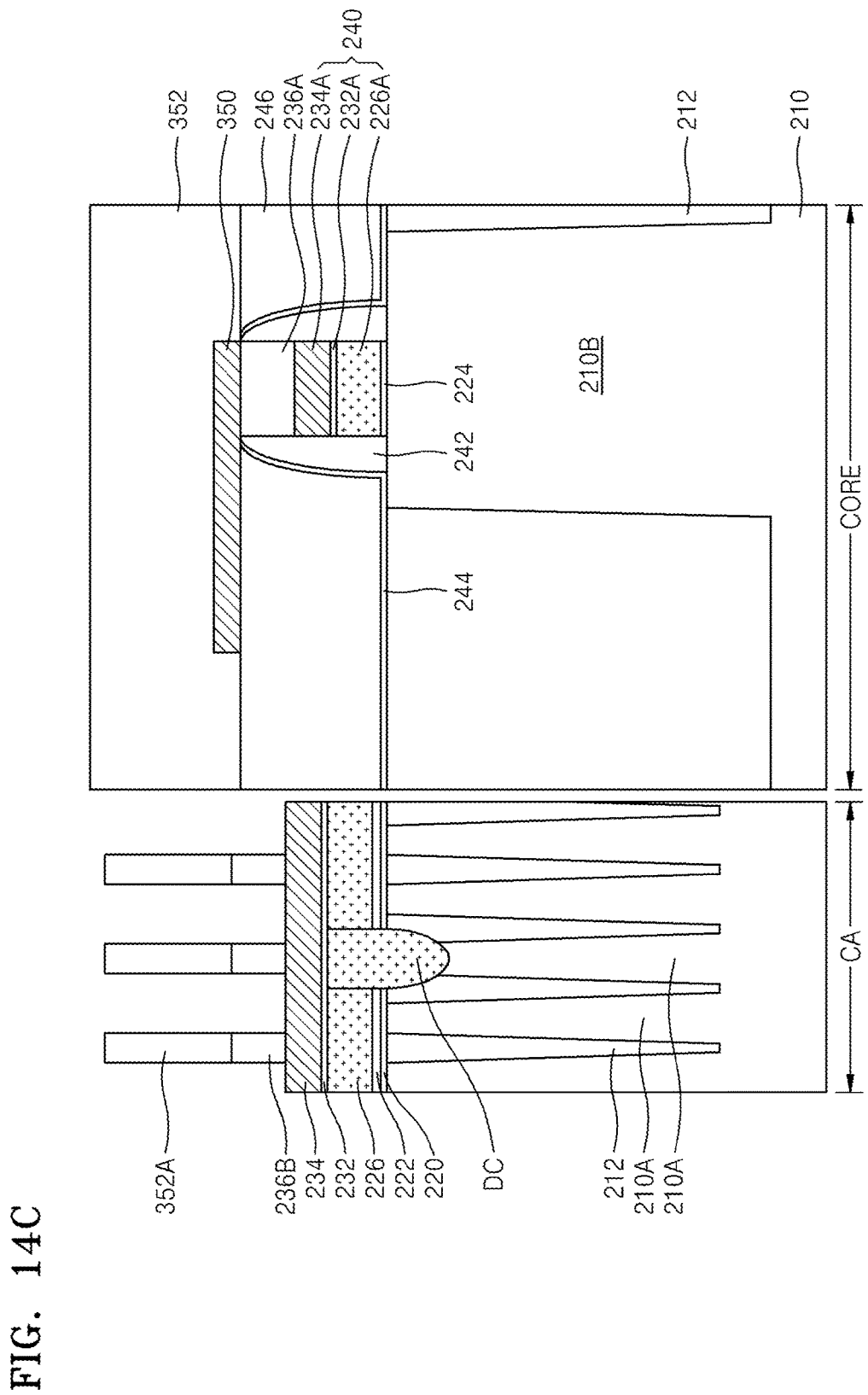

Referring to FIG. 14C, the insulating layer 352 and the capping layer 236 are patterned by using photolithography. As a result, a cell mask pattern 352A and a capping pattern 236B, which is used as an etch mask for the formation of a plurality bit lines, are formed in the cell array area CA. In the core area CORE, the insulating layer 352 is maintained intact.

Figure 14D:
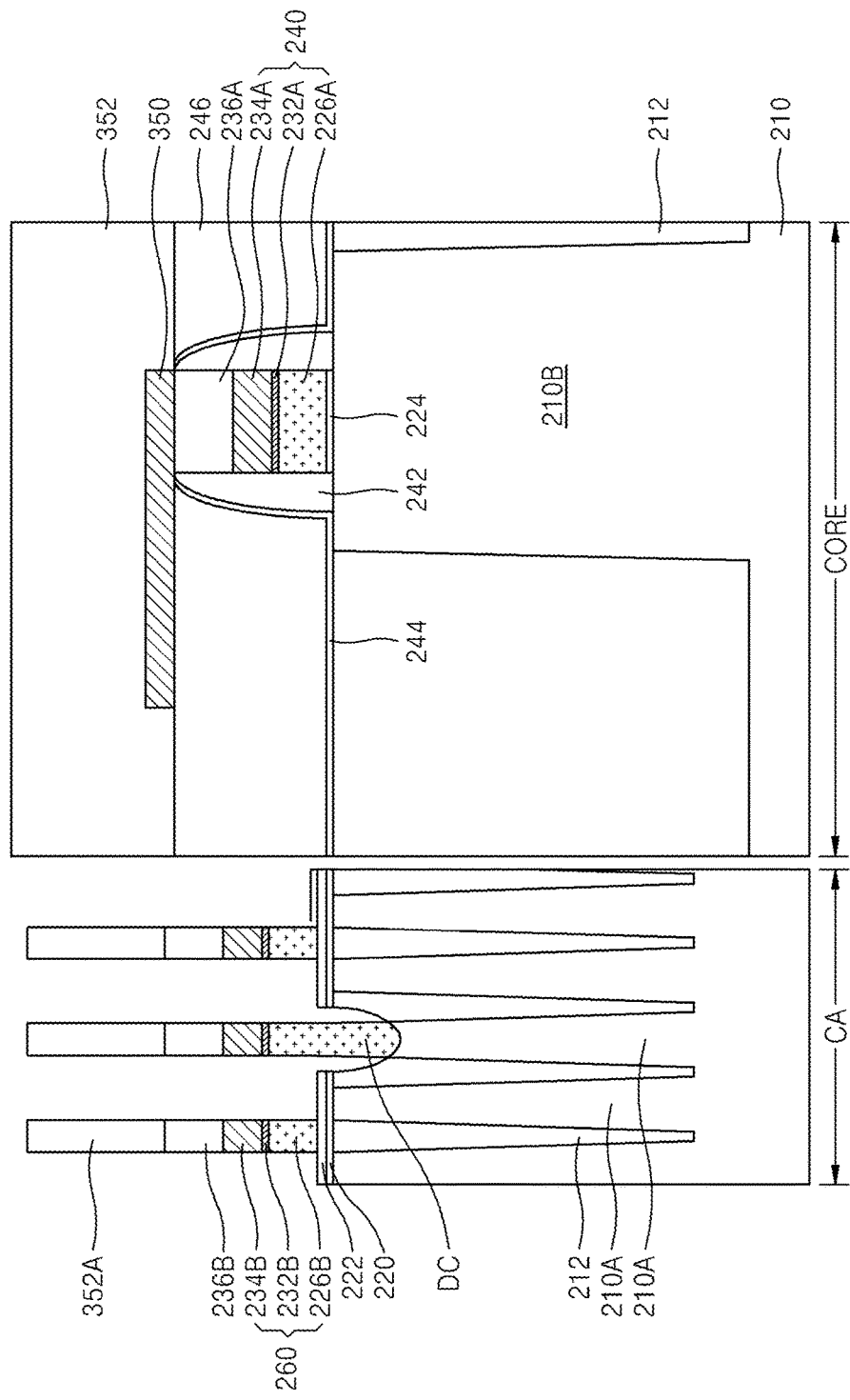

Referring to FIG. 14D, a portion of a structure under the cell mask pattern 252A and the capping pattern 236B is etched by using the cell mask pattern 252A and the capping pattern 236B as an etch mask, and thus, a plurality of bit lines 260 are formed in the cell array area CA.

Figure 14E:
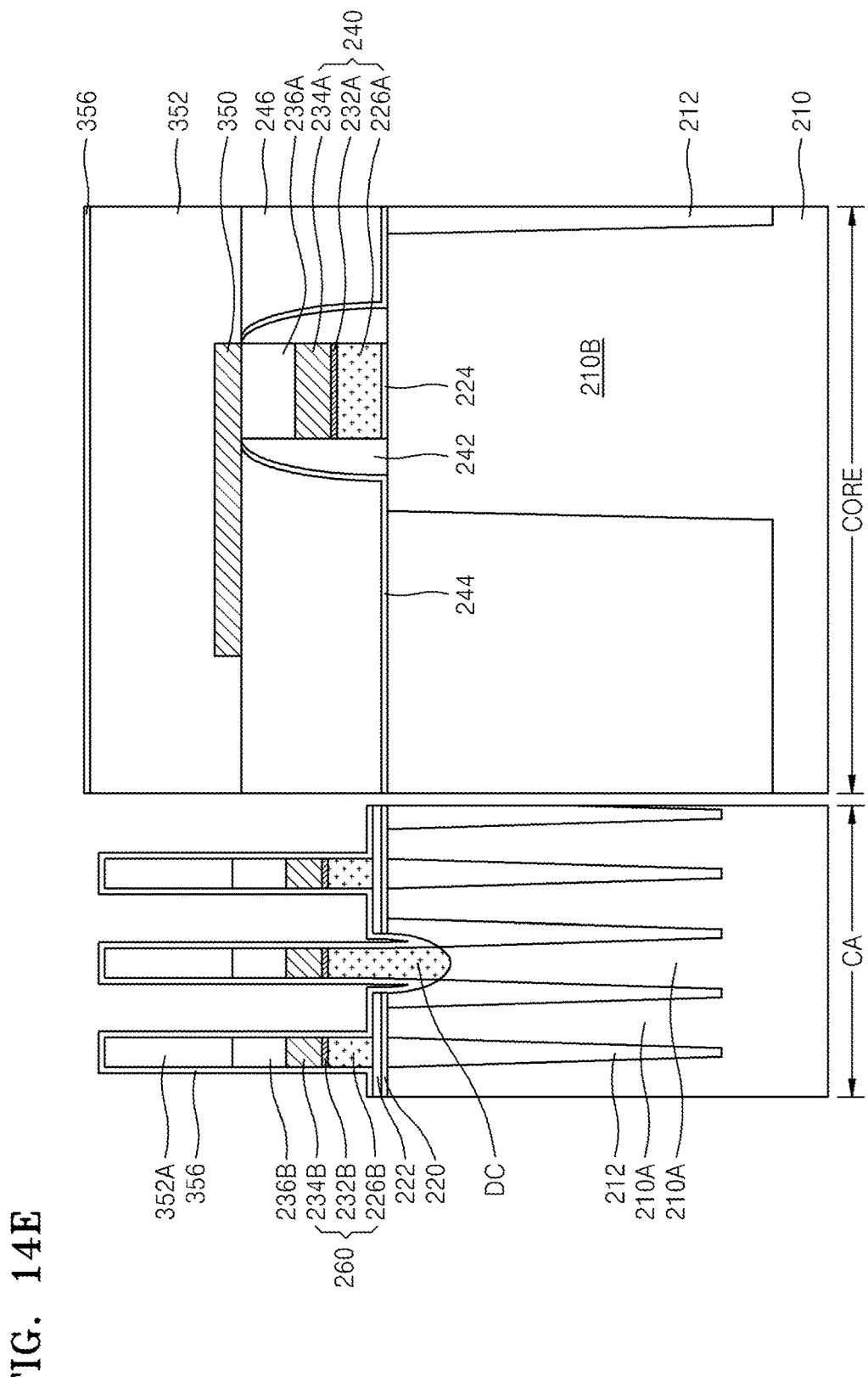

Referring to FIG. 14E, an insulating liner 356 is formed on a resultant structure of the cell array area CA after the plurality of bit lines 260 was formed, and on the insulating layer 352 remaining in the core area CORE. The insulating liner 356 may be formed of nitride. However, example embodiments of the inventive concepts are not limited thereto.

Figure 14F:
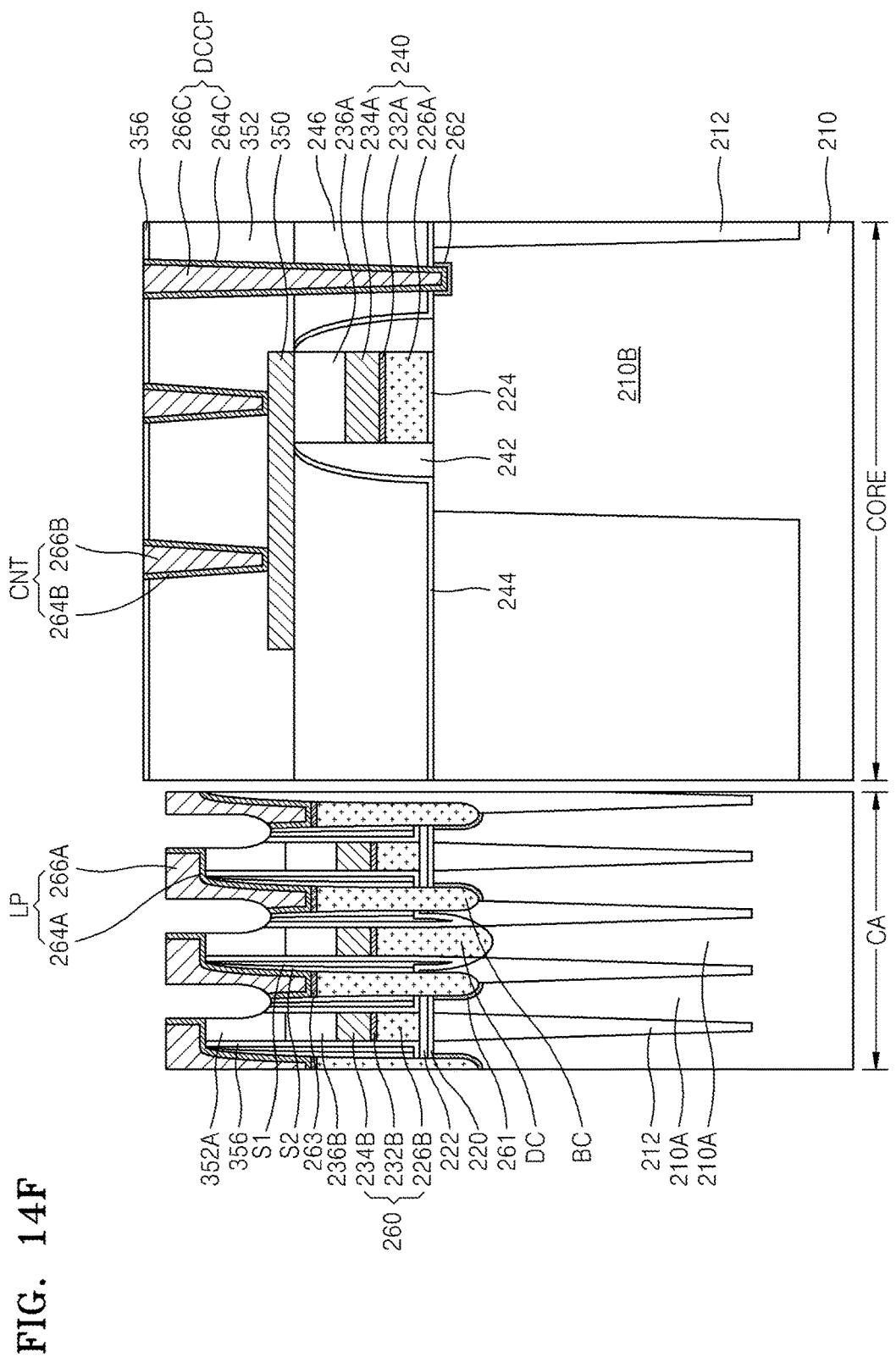

Referring to FIG. 14F, by performing the processes described with reference to FIG. 12L, a plurality of buried contacts BC and a plurality of landing pads LP are formed in the cell array area CA, and a plurality of contact plugs CNT, which are connected to the bypass interconnection line 350, and a direct contact plug DCCP are formed in the core area CORE.

The plurality of contact plugs CNT and the direct contact plug DCCP may be simultaneously formed together with the plurality of landing pads LP of the cell array area CA.

Figure 14G:
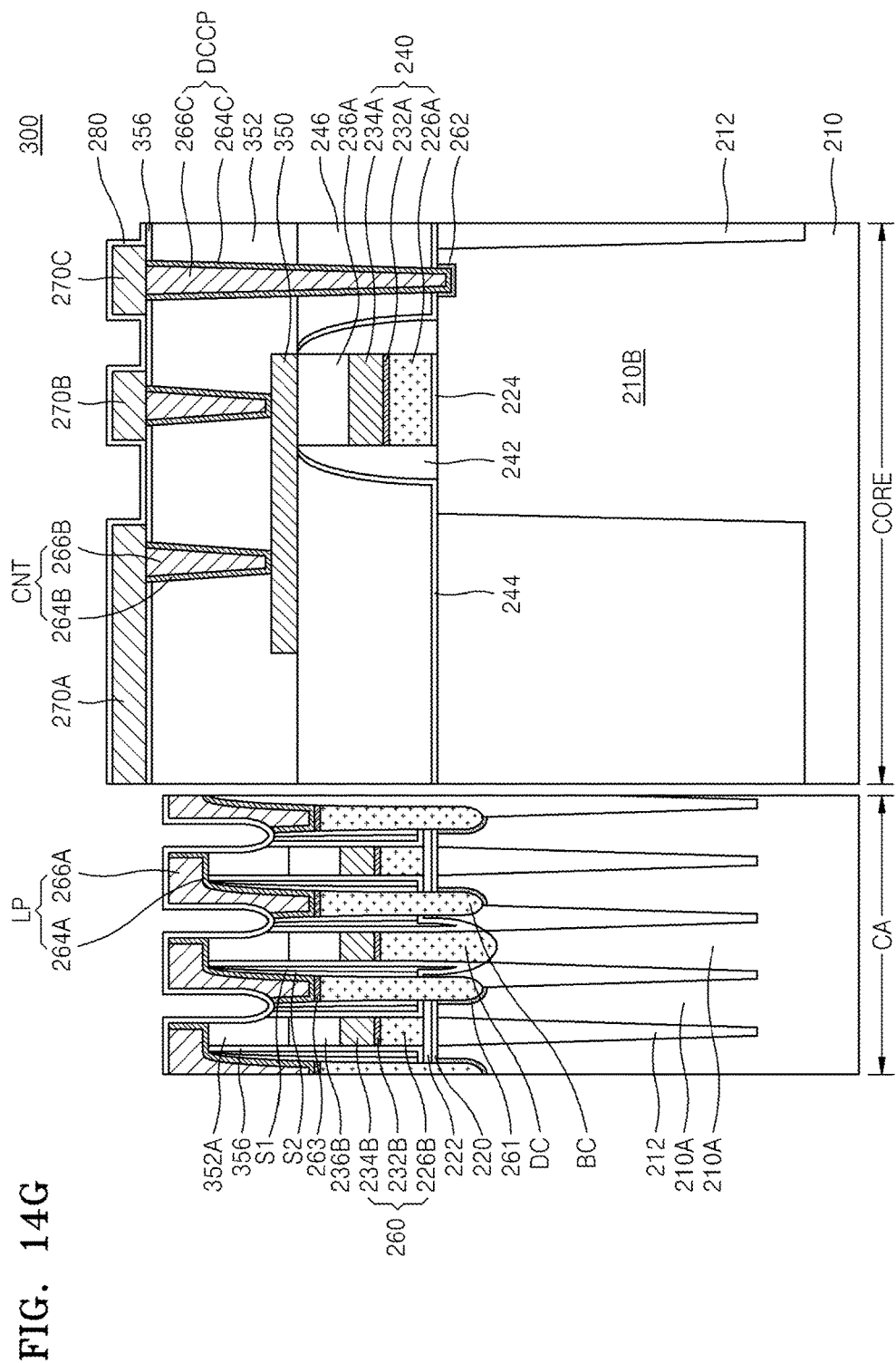

Referring to FIG. 14G, a plurality of interconnection layers 270A, 270B, and 270C are formed on the insulating layer 352 in the core area CORE.

Next, an insulating thin film 280 is formed on an upper surface of a resultant structure that includes the plurality of conductive landing pads LP formed in the cell array area CA and the plurality of interconnection layers 270A, 270B, and 270C formed in the core area CORE.

Next, the semiconductor device 300 may be formed by forming an insulating layer on the insulating thin film 280 in the cell array area CA and the core area CORE, forming a plurality of capacitor lower electrodes (corresponding to the lower electrode ST of FIG. 10) capable of being electrically connected to the plurality of conductive landing pads LP in the cell array area CA, and forming a multi-layered interconnection structure in the core area CORE.

Figure 15:
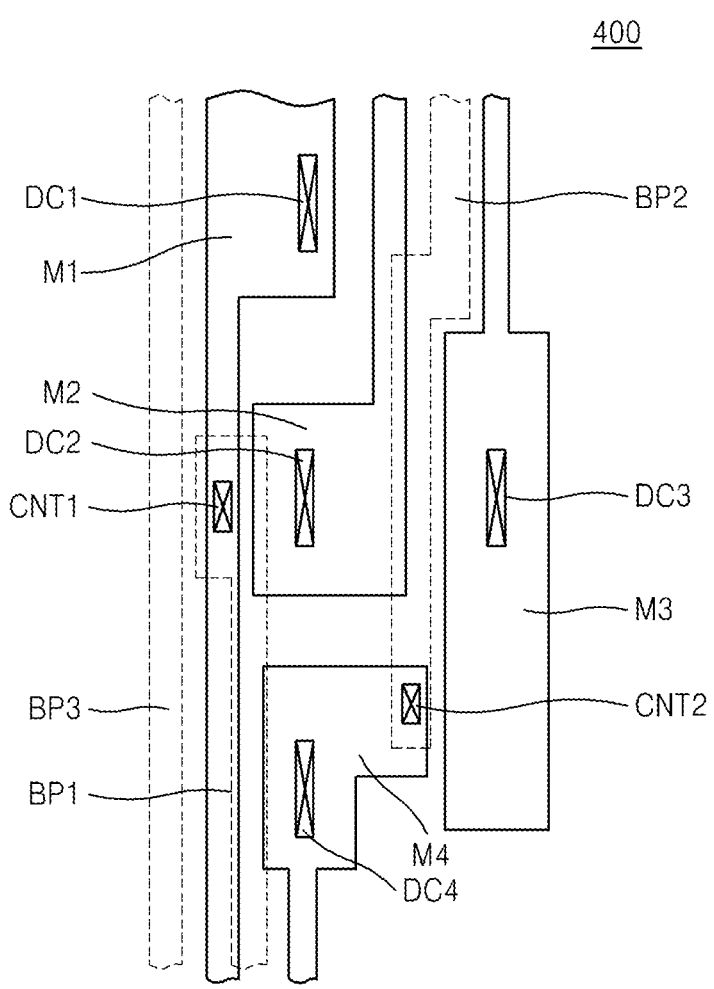
FIG. 15 is an example layout of some elements of a semiconductor device according to an example embodiment of the inventive concepts.

FIG. 15 is an example layout of some elements of a semiconductor device 400 according to an example embodiment of the inventive concepts. The layout illustrated in FIG. 15 may correspond to a core area that is disposed around the memory cell array block MCA of FIG. 9.

Referring to FIG. 15, the semiconductor device 400 includes a plurality of interconnection lines M1, M2, M3, and M4 that extend apart from one another on a first plane. At least some of the plurality of interconnection lines M1, M2, M3, and M4 extend parallel to one another.

A plurality of bypass interconnection line BP1, BP2, and BP3 are formed on a second plane different from the first plane where the plurality of interconnection lines M1, M2, M3, and M4 are formed. In some example embodiments, the second plane may be at a lower level than the first plane. In other example embodiments, the second plane may be at a higher level than the first plane.

Some of the plurality of interconnection lines M1, M2, M3, and M4 are connected to any one of the plurality of bypass interconnection line BP1, BP2, and BP3 via any one of a plurality of contacts CNT1 and CNT2.

The plurality of interconnection lines M1, M2, M3, and M4 are connected to another conductive area spaced apart from the plurality of bypass interconnection line BP1, BP2, and BP3, via a plurality of direct contacts DC1, DC2, DC3, and DC4.

The plurality of bypass interconnection lines BP1, BP2, and BP3 may include portions that overlap with some of the plurality of interconnection lines M1, M2, M3, and M4. The plurality of bypass interconnection lines BP1, BP2, and BP3 do not vertically overlap with the plurality of direct contacts DC1, DC2, DC3, and DC4.

In some example embodiments, the plurality of bypass interconnection lines BP1, BP2, and BP3 may be formed in the core area CORE of the semiconductor device 200 or 300 at the same time with the bypass interconnection line 250P described with reference to FIG. 12K or the bypass interconnection line 350 described with reference to FIG. 14A. The plurality of contacts CNT1 and CNT2 may be formed in the core area CORE of the semiconductor device 200 or 300 at the same time as the formation of the plurality of landing pads LP and the plurality of contact plugs CNT, which are described above with reference to FIG. 12L. The plurality of interconnection lines M1, M2, M3, and M4 may be formed in the core area CORE of the semiconductor device 200 or 300 at the same time with the plurality of interconnection lines 270A, 270B, and 270C described with reference to FIG. 12M or FIG. 14G.

In the semiconductor device 400 illustrated in FIG. 15, by forming the plurality of bypass interconnection lines BP1, BP2, and BP3 for bypassing paths of some of the plurality of interconnection lines M1, M2, M3, and M4 at a level different from a level at which the plurality of interconnection lines M1, M2, M3, and M4 are formed, interconnection line density may be lowered at the level at which the plurality of interconnection lines M1, M2, M3, and M4 are formed. In addition, a chip size of the semiconductor device 400 may be reduced by implementing an interconnection layout that may increase or maximize integration density.

Figure 16:
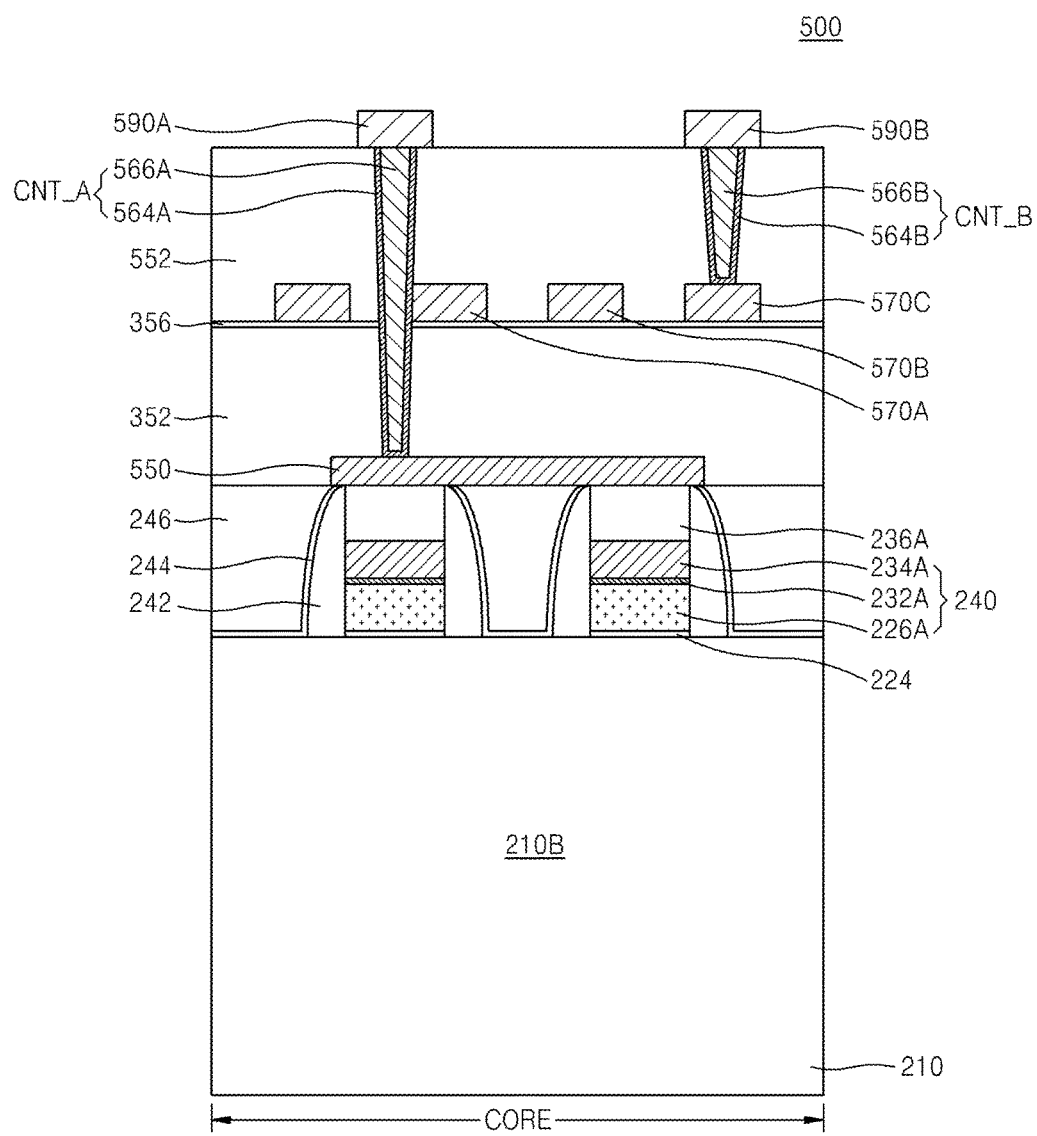
FIG. 16 is a cross-sectional view of some elements of a semiconductor device according to another example embodiment of the inventive concepts.

FIG. 16 is a cross-sectional view of some elements of a semiconductor device 500 according to another example embodiment of the inventive concepts. In FIGS. 12A through 14G and FIG. 16, the same elements are denoted by the same reference numerals, and thus repeated descriptions are omitted.

A plurality of gate electrodes 240 for peripheral circuits are formed on a substrate 210 in the core area CORE of the semiconductor device 500. A bypass interconnection line 550 for short-circuit protection is formed on tops of the plurality of gate electrodes 240.

The bypass interconnection line 550 may be positioned on the same plane as the bypass interconnection line 250P illustrated in FIG. 12N or the bypass interconnection line 350 illustrated in FIG. 14G at the same level at which the bypass interconnection line 250P or the bypass interconnection line 350 is formed on the substrate 210.

The bypass interconnection line 550 may be formed to cover at least some of the plurality of gate electrodes 240.

The bypass interconnection line 550 may be formed at the same time as the bypass interconnection line 250P illustrated in FIG. 12N or the bypass interconnection line 350 illustrated in FIG. 14G. The bypass interconnection line 550 may have the same structure as the bypass interconnection line 250P illustrated in FIG. 12N or the bypass interconnection line 350 illustrated in FIG. 14G.

A plurality of lower interconnection layers 570A, 570B, and 570C are formed on an insulating liner 356 that is formed on an insulating layer 352 covering the bypass interconnection line 550. In some example embodiments, each of the plurality of lower interconnection layers 570A, 570B, and 570C may form a bit line that is formed in the core area CORE.

A plurality of upper interconnection layers 590A and 590B are formed on an insulating layer 552 covering the plurality of lower interconnection layers 570A, 570B, and 570C. The plurality of upper interconnection layers 590A and 590B may be connected to any one of the plurality of lower interconnection layers 570A, 570B, and 570C via a first contact CNT_A and a second contact CNT_B, respectively. The first contact CNT_A includes a first conductive barrier layer 564A and a first conductive layer 566A. The second contact CNT_B includes a second conductive barrier layer 564B and a second conductive layer 566B. Other details of the first and second barrier layers 564A and 564B and first and second conductive layers 566A and 566B are generally the same as those of the first conductive barrier layer 264A and first conductive layer 266A described with reference to FIG. 12L.

The second contact CNT_B among the first and second contacts CNT_A and CNT_B may be on an upper surface of the lower interconnection layer 570C so as to be connected to the lower interconnection layer 570C. In some example embodiments, at least one of the first and second contacts CNT_A and CNT_B may be misaligned at a position different from an intended position unlike a desired design. For example, the first contact CNT_A may be misaligned at a position different from a desired position, and thus may not land on an upper surface of the lower interconnection layer 570A, and may extend up to an upper surface of the bypass interconnection line 550 while penetrating the insulating layers 552 and 352 near the lower interconnection layer 570A.

When the bypass interconnection line 550 does not exist on the gate electrodes 240 at a position where the first contact CNT_A penetrates the insulating layers 552 and 352, the first contact CNT_A extends up to the gate electrodes 240, and thus, an undesired short circuit may occur between the first contact CNT_A and the gate electrodes 240 for peripheral circuits.

The semiconductor device 500 illustrated in FIG. 16 includes the bypass interconnection line 550, which covers at least some of the plurality of gate electrodes 240. Thus, although the first contact CNT_A is at an undesired position as a result of misalignment, the first contact CNT_A is on the bypass interconnection line 550 and does not extend up to another lower conductive layer, and thus, an undesired short circuit may be prevented.

The bypass interconnection line 550 may be formed at the same time as a bypass interconnection line that is formed at another position of the core area CORE, for example, the bypass interconnection line 250P illustrated in FIG. 12N or the bypass interconnection line 350 illustrated in FIG. 14G. Thus, the bypass interconnection line 550 may be easily formed without using a separate process.

Figure 17:
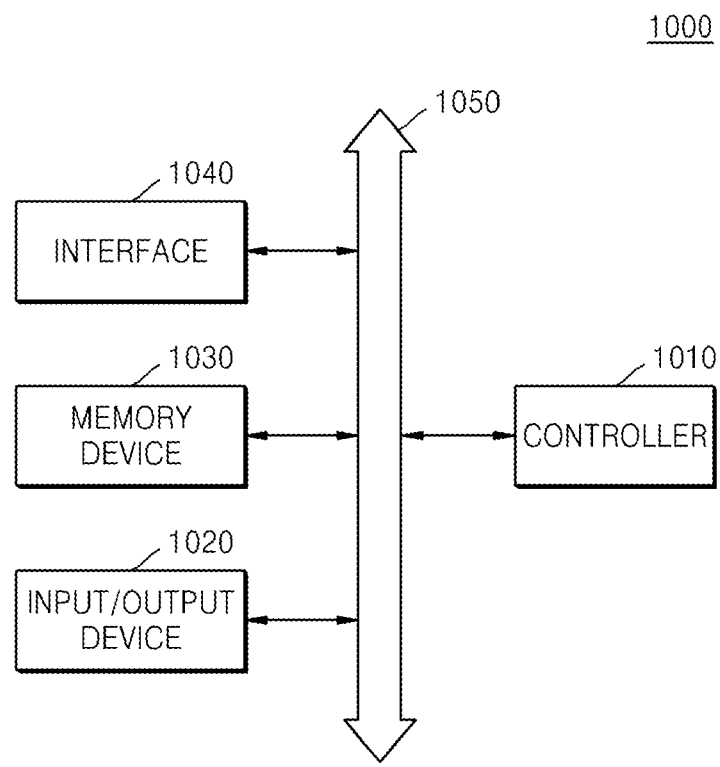
FIG. 17 is a block diagram of a system including a semiconductor device, according to an example embodiment of the inventive concepts.

FIG. 17 is a block diagram of a system 1000 including a semiconductor device, according to an example embodiment of the inventive concepts.

The system 1000 includes a controller 1010, an input/output device 1020, a memory device 1030, and an interface unit 1040. The system 1000 may be a mobile system or a system that transmits or receives information. In some example embodiments, the mobile system is a personal digital assistant (PDA), a portable computer, a web tablet, a wireless phone, a mobile phone, a digital music player, or a memory card. The controller 1010 for controlling an execution program of the system 1000 may be a microprocessor, a digital signal processor, a microcontroller, or a similar device. The input/output device 1020 may be used to input or output data of the system 1000. The system 1000 may be connected to an external device, for example, a personal computer (PC) or a network, and may exchange data with the external device, by using the input/output device 1020. The input/output device 1020 may be, for example, a keypad, a keyboard, or a display device.

The memory device 1030 may store codes and/or data for operating the controller 1010, or store data processed by the controller 1010. The memory device 1030 includes a semiconductor device according to any one of the above example embodiments of the inventive concepts. For example, the memory device 1030 includes at least one of the semiconductor devices 10, 10A, 100, 200, 300, 400, and 500 described with reference to FIGS. 1A through 15.

The interface unit 1040 may be a data transmission path between the system 1000 and an external device. The controller 1010, the input/output device 1020, the memory device 1630, and the interface unit 1040 may communicate with one another via a bus 1050. The system 1000 may be a mobile phone, an MP3 player, a navigation system, a portable multimedia player (PMP), a solid-state disk (SSD), or a household appliance.

Figure 18:
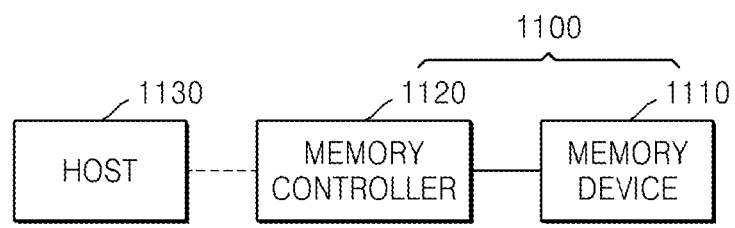
FIG. 18 is a block diagram of a memory card including a semiconductor device, according to an example embodiment of the inventive concepts.

FIG. 18 is a block diagram of a memory card 1100 including a semiconductor device, according to an example embodiment of the inventive concepts.

The memory card 1100 includes a memory device 1110 and a memory controller 1120.

The memory device 1110 may store data. In some example embodiments, the memory device 1110 may have nonvolatile characteristics and thus may retain stored data even when power supply thereto is cut off. The memory device 1110 includes a semiconductor device according to any one of the above example embodiments of the inventive concepts. For example, the memory device 1110 includes at least one of the semiconductor devices 10, 10A, 100, 200, 300, 400, and 500 described with reference to FIGS. 1A through 15.

The memory controller 1120 may read data from the memory device 1110 or write data to the memory device 1110 in response to a read/write request of a host 1130. The memory controller 1120 includes a semiconductor device according to any one of the above example embodiments of the inventive concepts. For example, the memory controller 1120 includes at least one of the semiconductor devices 10, 10A, 100, 200, 300, 400, and 500 described with reference to FIGS. 1A through 15.

While the inventive concepts has been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
    forming a plurality of interconnection lines extending along a first axis on a first plane at a first level on a substrate, the plurality of interconnection lines including a first interconnection line and a second interconnection line, the first interconnection line and the second interconnection line extending along a first axis on a first plane at first level on a substrate such that the first interconnection line and the second interconnection line are in alignment along the first axis with a gap therebetween, the substrate having an active region;

forming a direct contact plug extending in a direction perpendicular to the substrate towards the active region of the substrate;

forming a bypass interconnection line extending on a second plane at a second level on a substrate, the second level being different from the first level such that the bypass interconnection line includes a region that is skewed across the gap an amount in a direction perpendicular to the first axis and parallel to the substrate to electrically isolate the bypass interconnect line from the direct contact plug; and forming a plurality of contact plugs connected to the bypass interconnection line at a position spaced apart from the substrate such that the bypass interconnection line is connected to the first interconnection line and the second interconnection line via the plurality of contact plugs.

2. The method of claim 1, wherein the direct contact plug is formed at a same time as the plurality of contact plugs.

3. The method of claim 1, wherein the direct contact plug has an upper surface on a same plane as upper surfaces of the plurality of contact plugs.

4. The method of claim 1, wherein the forming of the plurality of interconnection lines comprises:

forming a third interconnection line that is adjacent to the first interconnection line and the second interconnection line, the third interconnection line being connected to the direct contact plug.

5. A method of manufacturing a semiconductor device, the method comprising:

forming a bypass interconnection line on a core area of a substrate;

forming a plurality of conductive lines on a cell array area of a substrate;

forming a plurality of buried contacts between the plurality of conductive lines in the cell array area, the plurality of buried contacts connected to an active region of the substrate;

forming a conductive landing pad and a plurality of contact plugs at a same time, the conductive landing pad extending from an upper surface of any one of the plurality of buried contacts to a top of any one of the plurality of conductive lines in the cell array area, the plurality of contact plugs connected to the bypass interconnection line in the core area; and forming a plurality of interconnection lines on a same plane, the plurality of interconnection lines including a first interconnection line and a second interconnection line, the first interconnection line extending apart from the second interconnection line at a level higher than an upper surface of the conductive landing pad in the core area, the first interconnection line and the second interconnection line connected to the plurality of contact plugs.

6. The method of claim 5, wherein the bypass interconnection line is formed at a same time as the plurality of conductive lines.

7. The method of claim 5, wherein the plurality of conductive lines are formed after the bypass interconnection line is formed.

8. The method of claim 5, wherein the forming of the bypass interconnection line comprises:

forming a conductive layer in the core area, the conductive layer associated with the bypass interconnection line;

forming a core mask pattern on the conductive layer; and etching the conductive layer using the core mask pattern as an etch mask such that the plurality of contact plugs penetrate the core mask pattern.

9. The method of claim 8, wherein the forming of the conductive landing pad and the plurality of contact plugs at the same time comprises:

forming a direct contact plug connected to the active region of the substrate in the core area such that the direct contact plug is at a position spaced apart from the core mask pattern.

10. The method of claim 5, further comprising:

forming an insulating layer covering the bypass interconnection line after the forming of the bypass interconnection line, wherein the plurality of contact plugs penetrate the insulating layer.

* * * * *